(12) United States Patent
Yu et al.

(10) Patent No.: US 11,264,363 B2
(45) Date of Patent: Mar. 1, 2022

(54) CHIP PACKAGE STRUCTURE WITH SEAL RING STRUCTURE

(71) Applicant: Taiwan Semiconductor Manufacturing Company, Ltd., Hsinchu (TW)

(72) Inventors: Chen-Hua Yu, Hsinchu (TW); An-Jhih Su, Taoyuan (TW); Jing-Cheng Lin, Hsinchu (TW); Po-Hao Tsai, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/019,651

(22) Filed: Sep. 14, 2020

(65) Prior Publication Data

US 2020/0411485 A1 Dec. 31, 2020

Related U.S. Application Data

(62) Division of application No. 16/159,816, filed on Oct. 15, 2018, now Pat. No. 10,804,247, which is a
(Continued)

(51) Int. Cl.
*H01L 25/065* (2006.01)
*H01L 21/56* (2006.01)
(Continued)

(52) U.S. Cl.
CPC ........ *H01L 25/0657* (2013.01); *H01L 21/561* (2013.01); *H01L 21/78* (2013.01);
(Continued)

(58) Field of Classification Search
CPC ... H01L 25/0657; H01L 21/561; H01L 21/78; H01L 23/3128; H01L 23/49822;
(Continued)

(56) References Cited

U.S. PATENT DOCUMENTS 8,361,842 B2   1/2013 Yu et al.
8,680,647 B2   3/2014 Yu et al.
(Continued)

FOREIGN PATENT DOCUMENTS

CN   102468275 A   5/2012
CN   104716105 A   6/2015
(Continued)

OTHER PUBLICATIONS

Chinese language office action dated Feb. 24, 2021, issued in application No. CN 201710541143.7.
(Continued)

*Primary Examiner* — Matthew E Warren
(74) *Attorney, Agent, or Firm* — McClure, Qualey & Rodack, LLP

(57) ABSTRACT

A chip package structure is provided. The chip package structure includes a redistribution structure including a dielectric structure, a redistribution line, and a seal ring structure. The redistribution line and the seal ring structure are in the dielectric structure, the seal ring structure continuously surrounds the redistribution line, the seal ring structure includes a first seal ring and a second seal ring over and electrically connected to the first seal ring, and the redistribution structure has a first sidewall, a first surface, and a second surface opposite to the first surface. The chip package structure includes a chip structure over the first surface. The chip package structure includes a ground bump over the second surface. The chip package structure includes a conductive shielding film covering the chip structure and the first sidewall of the redistribution structure.

20 Claims, 27 Drawing Sheets

Related U.S. Application Data division of application No. 15/362,690, filed on Nov. 28, 2016, now Pat. No. 10,103,125.

(51) Int. Cl.

| | |
|---|---|
| *H01L 25/00* | (2006.01) |
| *H01L 25/10* | (2006.01) |
| *H01L 23/552* | (2006.01) |
| *H01L 21/78* | (2006.01) |
| *H01L 23/31* | (2006.01) |
| *H01L 23/498* | (2006.01) |
| *H01L 23/00* | (2006.01) |
| *H01L 23/60* | (2006.01) |
| *H01L 23/538* | (2006.01) |
| *H01L 21/48* | (2006.01) |

(52) U.S. Cl.
CPC .... *H01L 23/3128* (2013.01); *H01L 23/49822* (2013.01); *H01L 23/49827* (2013.01); *H01L 23/552* (2013.01); *H01L 23/562* (2013.01); *H01L 23/60* (2013.01); *H01L 25/105* (2013.01); *H01L 25/50* (2013.01); *H01L 21/486* (2013.01); *H01L 21/568* (2013.01); *H01L 23/49805* (2013.01); *H01L 23/5389* (2013.01); *H01L 2224/18* (2013.01); *H01L 2224/32145* (2013.01); *H01L 2224/48091* (2013.01); *H01L 2224/48227* (2013.01); *H01L 2224/73265* (2013.01); *H01L 2225/0651* (2013.01); *H01L 2225/06548* (2013.01); *H01L 2225/06568* (2013.01); *H01L 2924/181* (2013.01)

(58) Field of Classification Search
CPC ..... H01L 23/562; H01L 23/60; H01L 25/105; H01L 25/50; H01L 21/486; H01L 21/568; H01L 23/49805; H01L 23/5389; H01L 2224/18; H01L 2224/32145; H01L 2224/48091; H01L 2224/48227; H01L 2224/73265; H01L 2225/0651; H01L 2225/06548; H01L 2225/06568; H01L 2924/181
USPC ....................................................... 257/659
See application file for complete search history.

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,209,053 B2 | 12/2015 | Goto et al. |
| 9,324,663 B2 | 4/2016 | Watanabe et al. |
| 9,349,694 B2 | 5/2016 | Shibuya et al. |
| 9,761,566 B1 * | 9/2017 | Yu ........................ H01L 23/3128 |
| 9,793,222 B1 | 10/2017 | Lee |
| 9,842,826 B2 | 12/2017 | Lin |
| 2011/0291288 A1 | 12/2011 | Wu et al. |
| 2011/0304015 A1 | 12/2011 | Kim |
| 2012/0119346 A1 | 5/2012 | Im |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0264684 A1 | 10/2013 | Yu et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0318267 A1 | 11/2015 | Yu |
| 2016/0035678 A1 | 2/2016 | Yoo |
| 2017/0018531 A1 | 1/2017 | Lin |
| 2017/0062360 A1 * | 3/2017 | Chang ..................... H01L 21/78 |
| 2017/0179098 A1 | 6/2017 | Yoo |
| 2017/0317038 A1 | 11/2017 | Tsai |
| 2017/0345795 A1 | 11/2017 | Yang |
| 2018/0019211 A1 * | 1/2018 | Choi ................... H01L 21/6836 |
| 2018/0026010 A1 * | 1/2018 | Huang ................ H01L 23/3114 257/659 |
| 2019/0035716 A1 * | 1/2019 | Kita .................... H01L 23/3121 |

FOREIGN PATENT DOCUMENTS

| | | |
|---|---|---|
| CN | 104716272 A | 6/2015 |
| JP | 02-51233 A | 2/1990 |

OTHER PUBLICATIONS

Chinese language office action dated Aug. 25, 2020, issued in application No. CN 201710541143.7.

\* cited by examiner

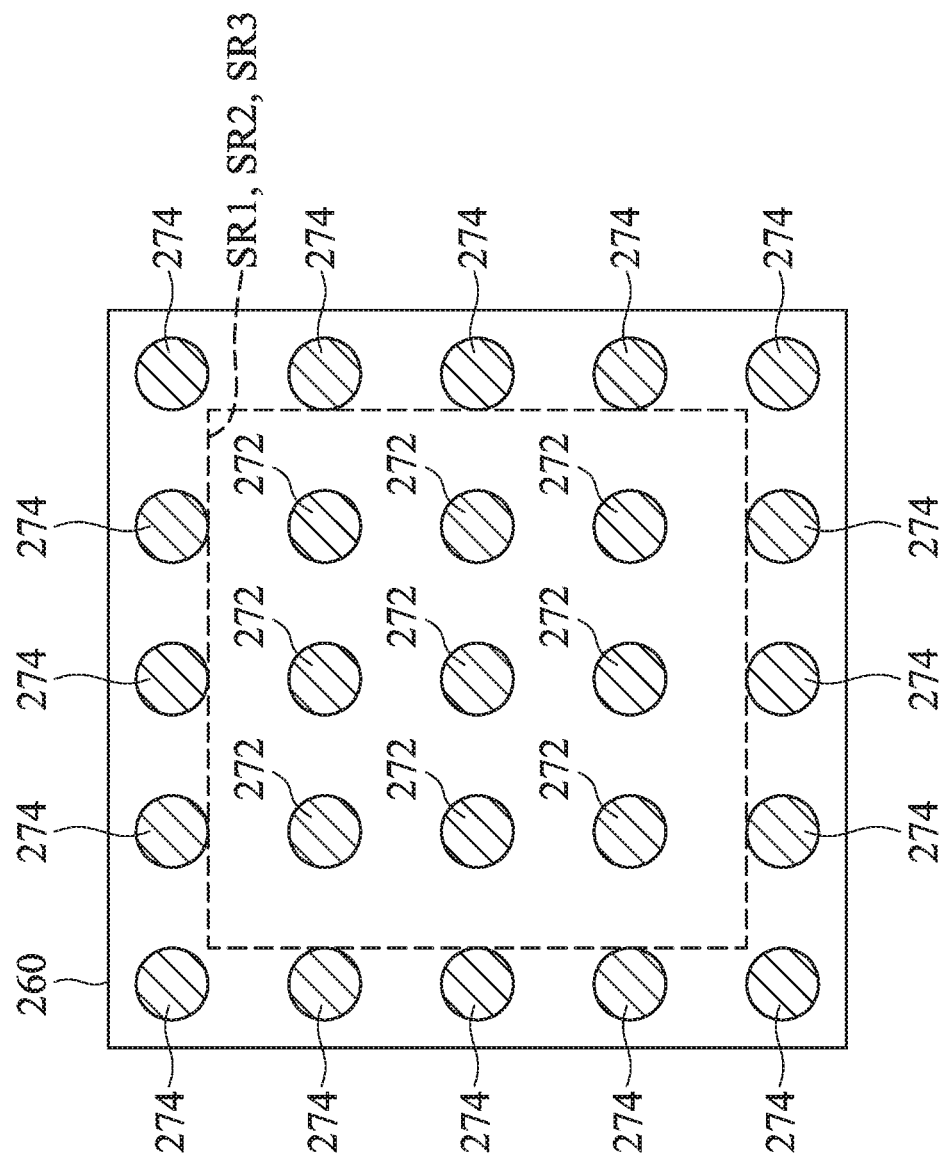

CHIP PACKAGE STRUCTURE WITH SEAL RING STRUCTURE

CROSS REFERENCE

This application is a Divisional of U.S. application Ser. No. 16/159,816, filed on Oct. 15, 2018, (now U.S. Pat. No. 10,804,247), which is a Divisional of U.S. application Ser. No. 15/362,690, filed on Nov. 28, 2016 (now U.S. Pat. No. 10,103,125, issued on Oct. 16, 2018), the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1O are cross-sectional views of various stages of a process for forming a chip package structure, in accordance with some embodiments.

FIG. 1N-1 is a top view of a tray in FIG. 1N, in accordance with some embodiments.

FIG. 1O-1 is an enlarged cross-sectional view of a region of FIG. 1O, in accordance with some embodiments.

FIG. 1O-2 is a bottom view of the chip package structure in FIG. 1O, in accordance with some embodiments.

FIG. 2B-1 is a bottom view of the chip package structure in FIG. 2B, in accordance with some embodiments.

FIG. 3B-1 is a bottom view of the chip package structure in FIG. 3B, in accordance with some embodiments.

DETAILED DESCRIPTION

Figure 1A:
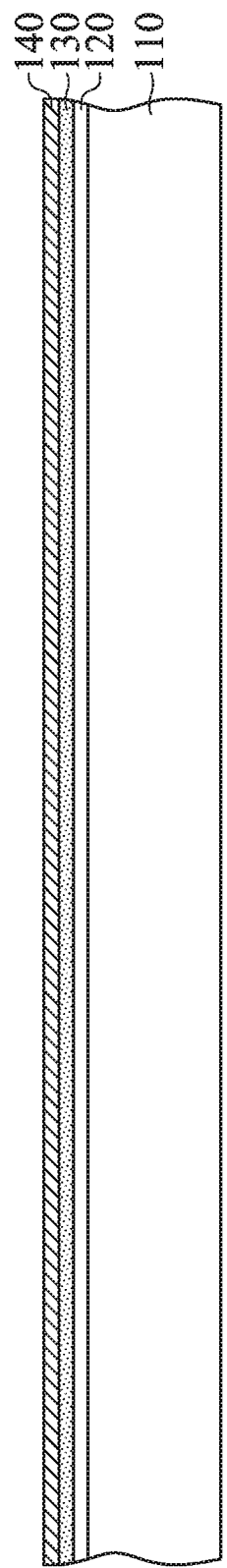

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1O are cross-sectional views of various stages of a process for forming a chip package structure, in accordance with some embodiments. As shown in FIG. 1A, a carrier substrate 110 is provided, in accordance with some embodiments. The carrier substrate 110 is configured to provide temporary mechanical and structural support during subsequent processing steps, in accordance with some embodiments. The carrier substrate 110 includes glass, silicon oxide, aluminum oxide, ceramic, metal, a combination thereof, and/or the like, in accordance with some embodiments. The carrier substrate 110 includes a metal frame, in accordance with some embodiments.

As shown in FIG. 1A, an adhesive layer 120 is formed over the carrier substrate 110, in accordance with some embodiments. The adhesive layer 120 includes any suitable adhesive material, such as an ultraviolet (UV) glue or a Light-to-Heat Conversion (LTHC) glue, which loses its adhesive properties when exposed to UV lights or laser, in accordance with some embodiments. The adhesive layer 120 is formed using a lamination process, a spin coating process, a printing process, or another suitable process.

As shown in FIG. 1A, a buffer layer 130 is formed over the adhesive layer 120, in accordance with some embodiments. The buffer layer 130 is configured to provide structural support for bonding and help reduce die shift and ball cracking issues during subsequent processes, in accordance with some embodiments. The buffer layer 130 includes a polymer material, such as polybenzoxazole (PBO), polyimide, or epoxy, in accordance with some embodiments. The buffer layer 130 is formed using a spin coating process, a chemical vapor deposition process, a laminating process, or a printing process, in accordance with some embodiments. In some embodiments, the buffer layer 130 is a composite layer including an adhesive layer.

As shown in FIG. 1A, a conductive layer 140 is formed over the buffer layer 130, in accordance with some embodiments. The conductive layer 140 includes copper, titanium, combinations thereof, or another suitable conductive material. The conductive layer 140 is formed using a physical vapor deposition process, a chemical vapor deposition process, or a laminating process, in accordance with some embodiments.

Figure 1B:
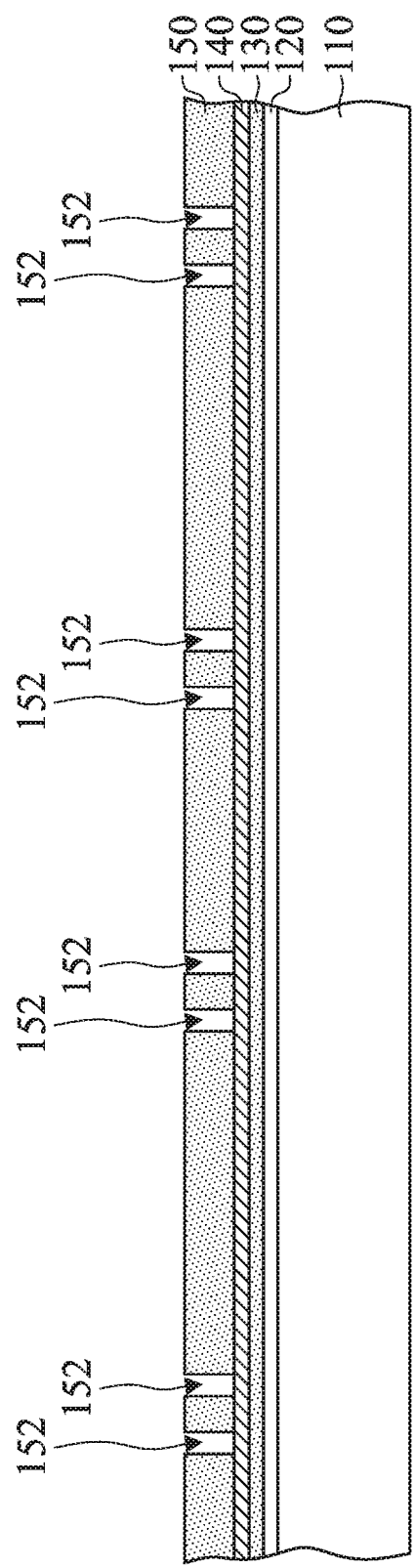

As shown in FIG. 1B, a mask layer 150 is formed over the conductive layer 140, in accordance with some embodiments. The mask layer 150 has through holes 152 exposing portions of the conductive layer 140, in accordance with some embodiments. The mask layer 150 includes a photoresist material or another suitable material.

Figure 1C:
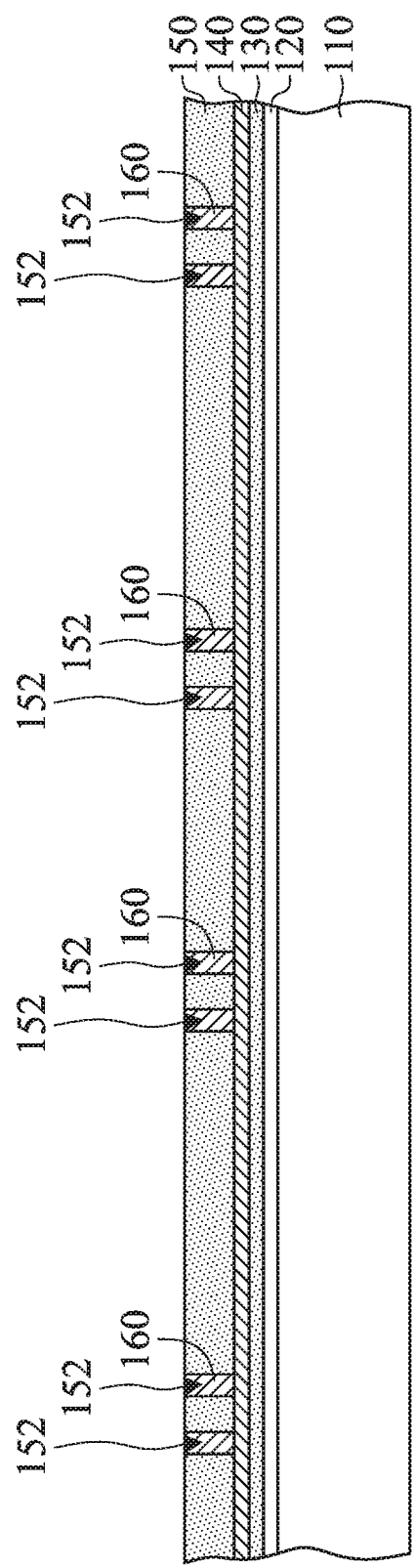

As shown in FIG. 1C, conductive via structures 160 are formed in the through holes 152, in accordance with some embodiments. The conductive via structures 160 are also referred to as conductive structures, in accordance with some embodiments. The conductive via structures 160 include copper or another suitable conductive material.

The formation of the conductive via structures 160 includes performing an electroplating process, in accordance with some embodiments. In some other embodiments, the conductive layer 140 is not formed, and the formation of the conductive via structures 160 includes performing a deposition process and a planarization process.

Figure 1D:
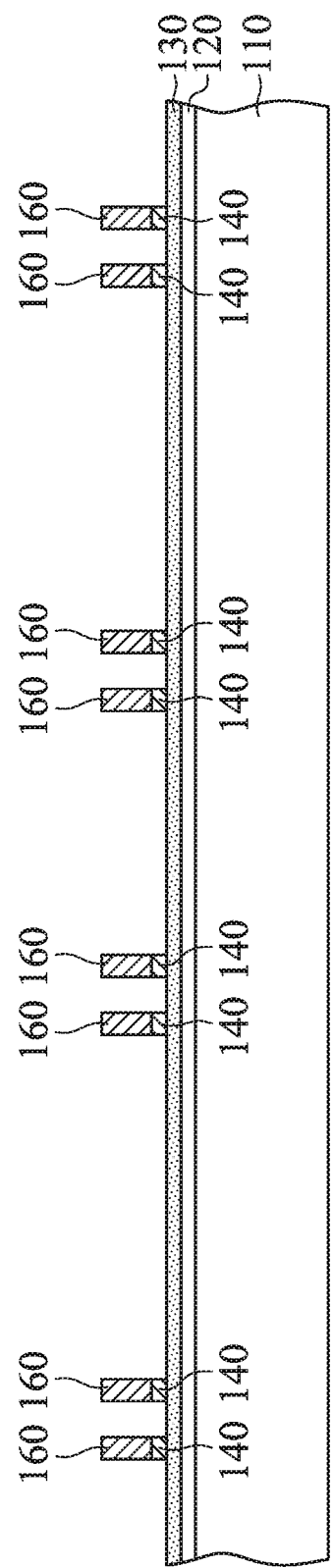

As shown in FIG. 1D, the mask layer 150 is removed, in accordance with some embodiments. The mask layer 150 is removed by dipping the mask layer 150 in a chemical solution, in accordance with some embodiments. The chemical solution includes, for example, ethyl lactate, anisole, methyl butyl acetate, amyl acetate, and/or diazo photoactive compound.

As shown in FIG. 1D, the conductive layer 140, which is not covered by the conductive via structures 160, is removed, in accordance with some embodiments. The removal process includes a wet etching process or a dry etching process, in accordance with some embodiments.

Figure 1E:
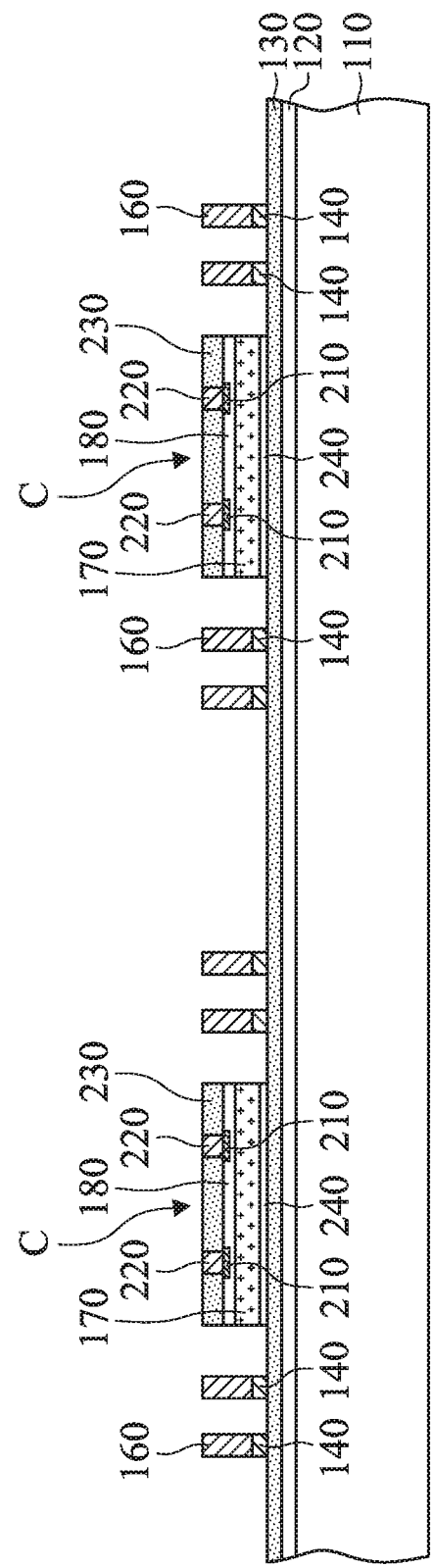

As shown in FIG. 1E, chip structures C are disposed over the buffer layer 130, in accordance with some embodiments. Each of the chip structures C includes a chip 170, a dielectric layer 180, bonding pads 210, interconnection structures 220, and a dielectric layer 230, in accordance with some embodiments. As shown in FIG. 1E, the chip 170 is disposed over the buffer layer 130, in accordance with some embodiments. The chip 170 is also referred to as a semiconductor substrate, a system-on-chip (SoC), a logic die, or a memory die, in accordance with some embodiments. In some other embodiments (not shown), each of the chip structures C includes chips 170.

As shown in FIG. 1E, in each of the chip structures C, the dielectric layer 180 is formed over the chip 170, in accordance with some embodiments. The bonding pads 210 are formed in the dielectric layer 180, in accordance with some embodiments. The bonding pads 210 are electrically connected to devices (not shown) formed in/over the chip 170, in accordance with some embodiments.

As shown in FIG. 1E, interconnection structures 220 are formed over the bonding pads 210 respectively, in accordance with some embodiments. The interconnection structures 220 include conductive pillars or conductive bumps, in accordance with some embodiments.

As shown in FIG. 1E, a dielectric layer 230 is formed over the dielectric layer 180 and surrounds the interconnection structures 220, in accordance with some embodiments. As shown in FIG. 1E, an adhesive layer 240 is positioned between the buffer layer 130 and the chip 170 to bond the chip 170 to the buffer layer 130, in accordance with some embodiments.

Figure 1F:
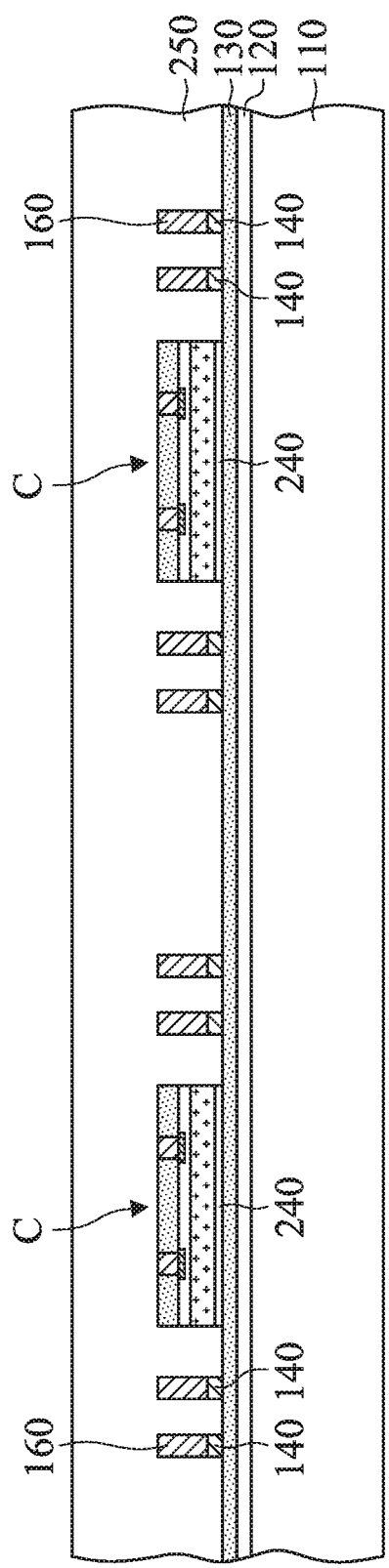

As shown in FIG. 1F, a molding compound layer 250 is formed over the buffer layer 130 to cover the conductive layer 140, the conductive via structures 160, the chip structures C, and the adhesive layer 240, in accordance with some embodiments. The molding compound layer 250 includes a polymer material, in accordance with some embodiments. The molding compound layer 250 is formed using a molding process, in accordance with some embodiments.

Figure 1G:
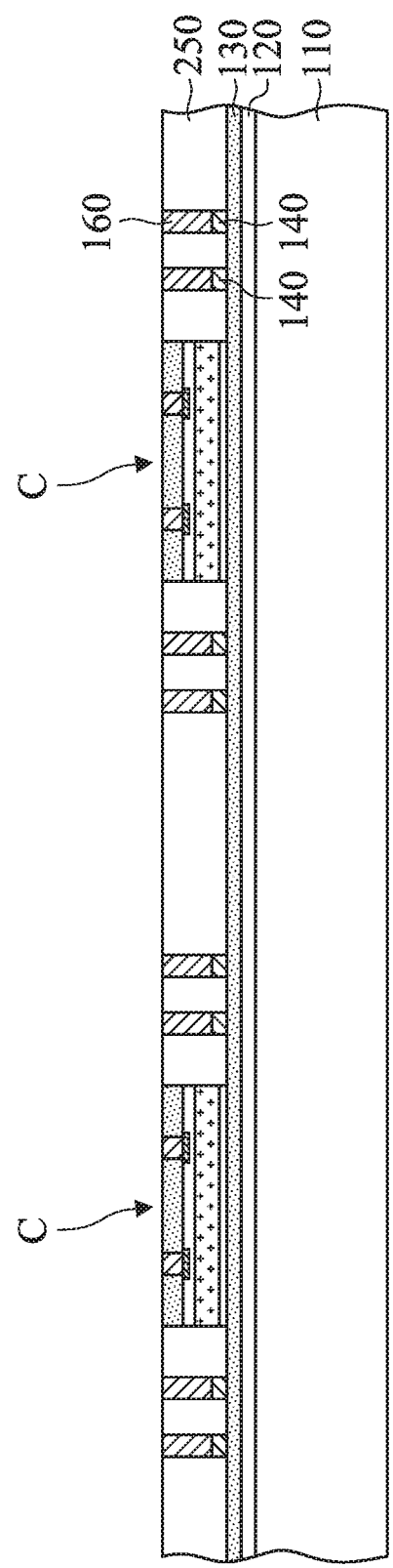

As shown in FIG. 1G, a top portion of the molding compound layer 250 is removed, in accordance with some embodiments. The removal process includes a grinding process or a chemical mechanical polishing process, in accordance with some embodiments. After the removal process, the molding compound layer 250 surrounds the chip structures C, the conductive layer 140, and the conductive via structures 160, in accordance with some embodiments.

Figure 1H:
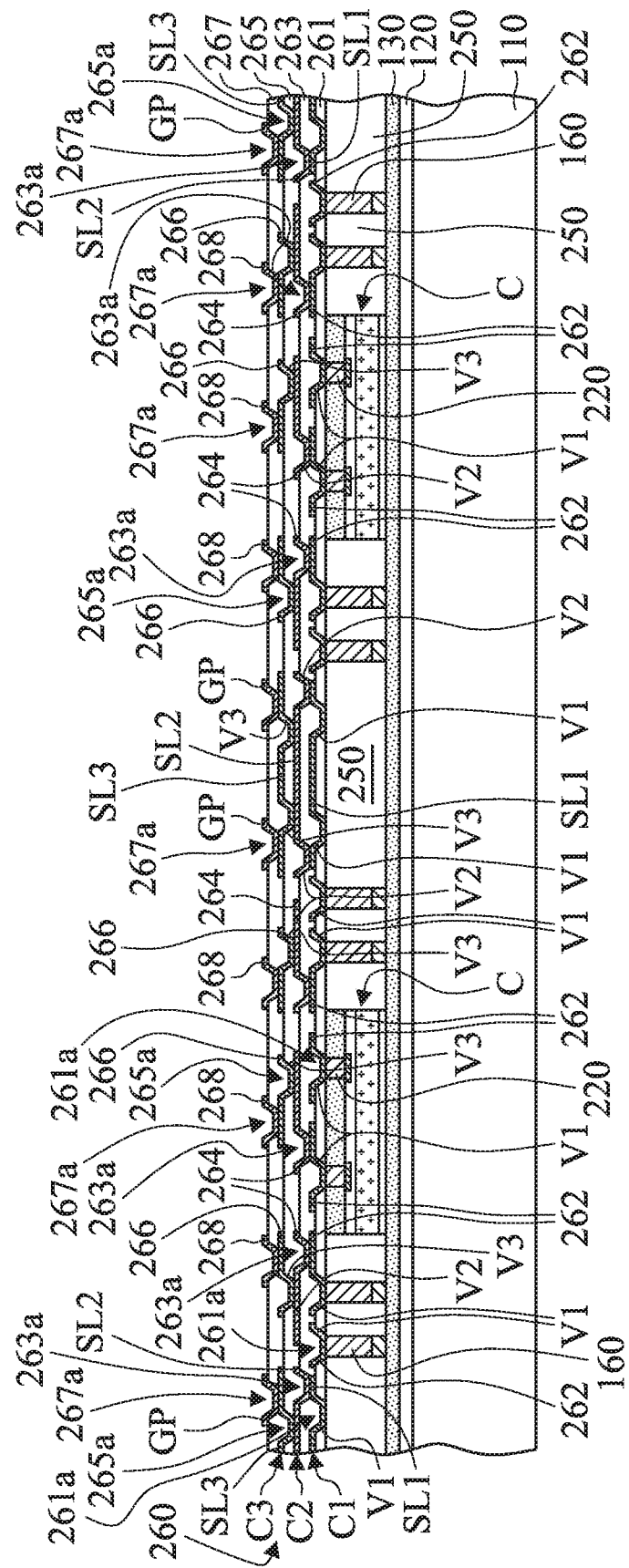

As shown in FIG. 1H, a dielectric layer 261 is formed over the chip structures C, the molding compound layer 250, and the conductive via structures 160, in accordance with some embodiments. The dielectric layer 261 has openings 261a exposing portions of the molding compound layer 250, the conductive via structures 160, and the interconnection structures 220, in accordance with some embodiments.

As shown in FIG. 1H, a patterned conductive layer C1 is formed over the dielectric layer 261, and conductive via structures V1 are formed in the openings 261a, in accordance with some embodiments. The patterned conductive layer C1 includes redistribution lines 262 and a seal layer SL1, in accordance with some embodiments.

The seal layer SL1 surrounds the redistribution lines 262, in accordance with some embodiments. The seal layer SL1 are electrically insulated from the redistribution lines 262, the conductive via structures 160, and the chip structures C, in accordance with some embodiments.

The conductive via structures V1 electrically connects the redistribution lines 262 thereover to the conductive via structures 160 and the interconnection structures 220 thereunder, in accordance with some embodiments. In some embodiments, the conductive via structures V1 are physically and electrically connected to the seal layer SL1.

In some embodiments, the seal layer SL1 is formed right over (or right on) the molding compound layer 250 between the chip structures C, in accordance with some embodiments. The patterned conductive layer C1 and the conductive via structures V1 include copper, aluminum, tungsten, titanium, gold, a combination thereof, or another suitable conductive material.

As shown in FIG. 1H, a dielectric layer 263 is formed over the patterned conductive layer C1 and the dielectric layer 261, in accordance with some embodiments. The dielectric layer 263 has openings 263a exposing portions of the redistribution lines 262 and the seal layer SL1, in accordance with some embodiments.

As shown in FIG. 1H, a patterned conductive layer C2 is formed over the dielectric layer 263, and conductive via structures V2 are formed in the openings 263a, in accordance with some embodiments. The patterned conductive layer C2 includes redistribution lines 264 and a seal layer SL2, in accordance with some embodiments.

The seal layer SL2 surrounds the redistribution lines 264, in accordance with some embodiments. The seal layer SL2 is electrically insulated from the redistribution lines 264, in accordance with some embodiments.

The conductive via structures V2 electrically connect the redistribution lines 264 thereover to the redistribution lines 262 thereunder, in accordance with some embodiments. The conductive via structures V2 electrically connect the seal layer SL2 thereover to the seal layer SL1 thereunder, in accordance with some embodiments. The patterned conductive layer C2 and the conductive via structures V2 include copper, aluminum, tungsten, titanium, gold, a combination thereof, or another suitable conductive material.

As shown in FIG. 1H, a dielectric layer 265 is formed over the patterned conductive layer C2 and the dielectric layer 263, in accordance with some embodiments. The dielectric layer 265 has openings 265a exposing portions of the redistribution lines 264 and the seal layer SL2, in accordance with some embodiments.

As shown in FIG. 1H, a patterned conductive layer C3 is formed over the dielectric layer 265, and conductive via structures V3 are formed in the openings 265a, in accordance with some embodiments. The patterned conductive layer C3 includes redistribution lines 266 and a seal layer SL3, in accordance with some embodiments. The seal layer SL3 surrounds the redistribution lines 266, in accordance with some embodiments. The seal layer SL3 is electrically insulated from the redistribution lines 266, in accordance with some embodiments.

The conductive via structures V3 electrically connect the redistribution lines 266 thereover to the redistribution lines 264 thereunder, in accordance with some embodiments. The conductive via structures V3 electrically connect the seal layer SL3 thereover to the seal layer SL2 thereunder, in accordance with some embodiments. The patterned conductive layer C3 and the conductive via structures V3 include copper, aluminum, tungsten, titanium, gold, a combination thereof, or another suitable conductive material.

As shown in FIG. 1H, a dielectric layer 267 is formed over the patterned conductive layer C3 and the dielectric layer 265, in accordance with some embodiments. The dielectric layer 267 has openings 267a exposing portions of the redistribution lines 266 and the seal layer SL3, in accordance with some embodiments.

As shown in FIG. 1H, pads 268 and grounding pads GP are formed over the dielectric layer 267, in accordance with some embodiments. The pads 268 extend into the openings 267a to electrically connect to the redistribution lines 266 thereunder, in accordance with some embodiments. The grounding pads GP extend into the openings 267a to electrically connect to the seal layer SL3, in accordance with some embodiments.

The dielectric layers 261, 263, 265, and 267 together form a dielectric structure D, in accordance with some embodiments. In some embodiments, the dielectric structure D and the molding compound layer 250 are made of different materials. The seal layers SL1, SL2, and SL3 are electrically insulated from the redistribution lines 262, 264, and 266 and the chip structures C by the dielectric structure D, in accordance with some embodiments. The dielectric structure D, the seal layers SL1, SL2, and SL3, the redistribution lines 262, 264, and 266, the conductive via structures V1, V2, and V3, the pads 268, and the grounding pads GP together form a redistribution structure 260, in accordance with some embodiments.

Figure 1I:
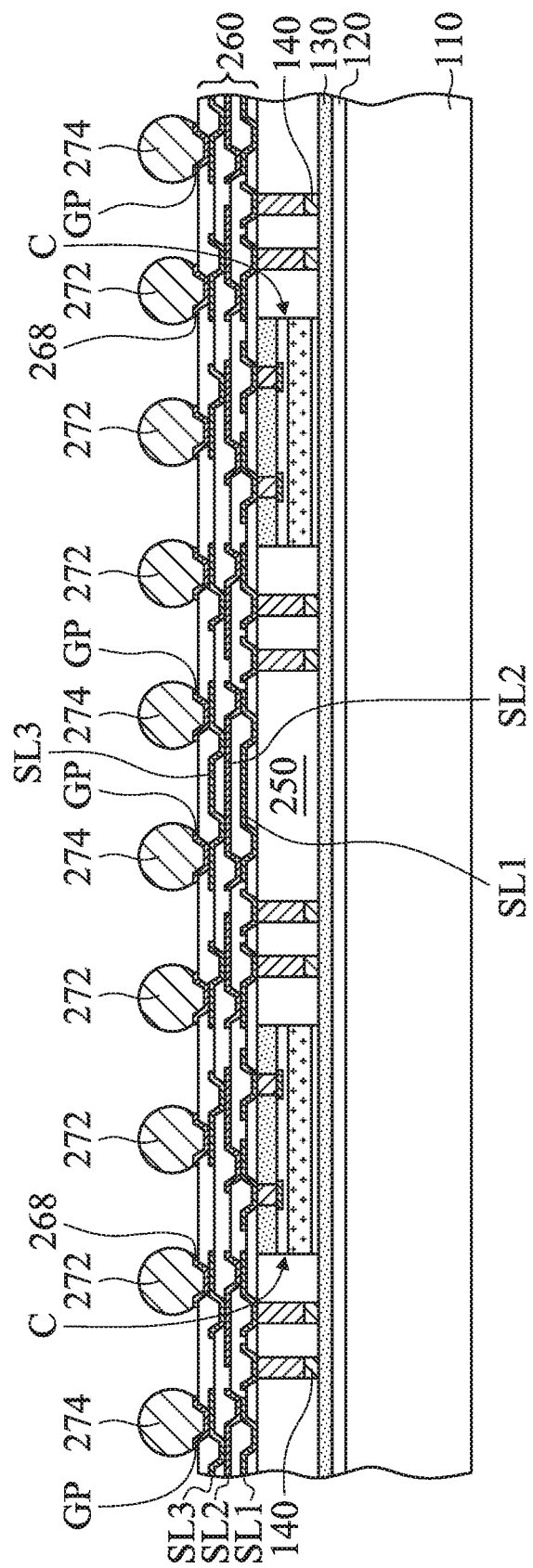

As shown in FIG. 1I, conductive bumps 272 and grounding bumps 274 are formed over the pads 268 and the grounding pads GP respectively, in accordance with some embodiments. The conductive bumps 272 and the grounding bumps 274 include tin (Sn) or another suitable material, in accordance with some embodiments.

The formation of the conductive bumps 272 and the grounding bumps 274 includes forming a solder paste over the pads 268 and the grounding pads GP and reflowing the solder paste, in accordance with some embodiments.

In some embodiments, the seal layers SL1, SL2, and SL3 are electrically grounded. In some embodiments, the seal layers SL1, SL2, and SL3 are electrically grounded through the grounding bumps 274.

Figure 1J:
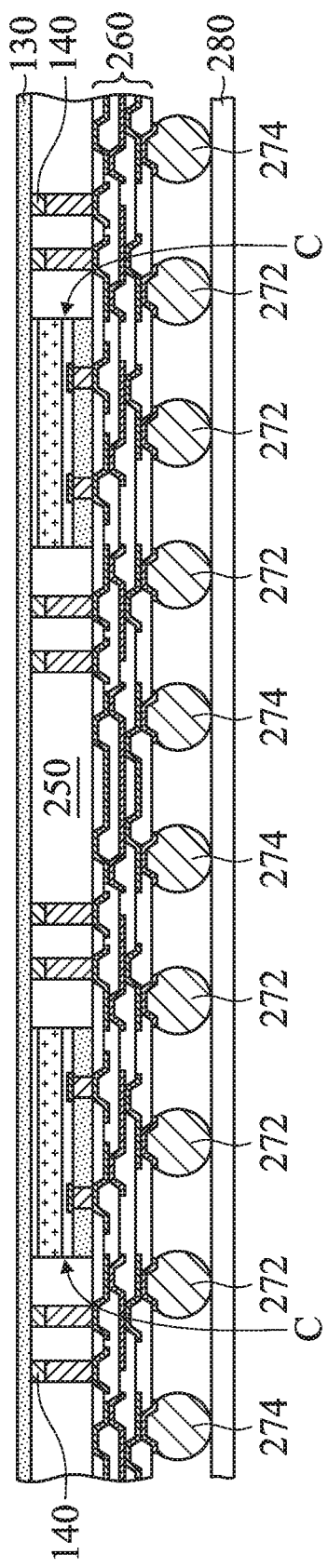

As shown in FIG. 1J, the chip structures C are flipped upside down and disposed over a frame 280 (or a carrier), in accordance with some embodiments. As shown in FIG. 1J, the carrier substrate 110 and the adhesive layer 120 are removed, in accordance with some embodiments.

Figure 1K:
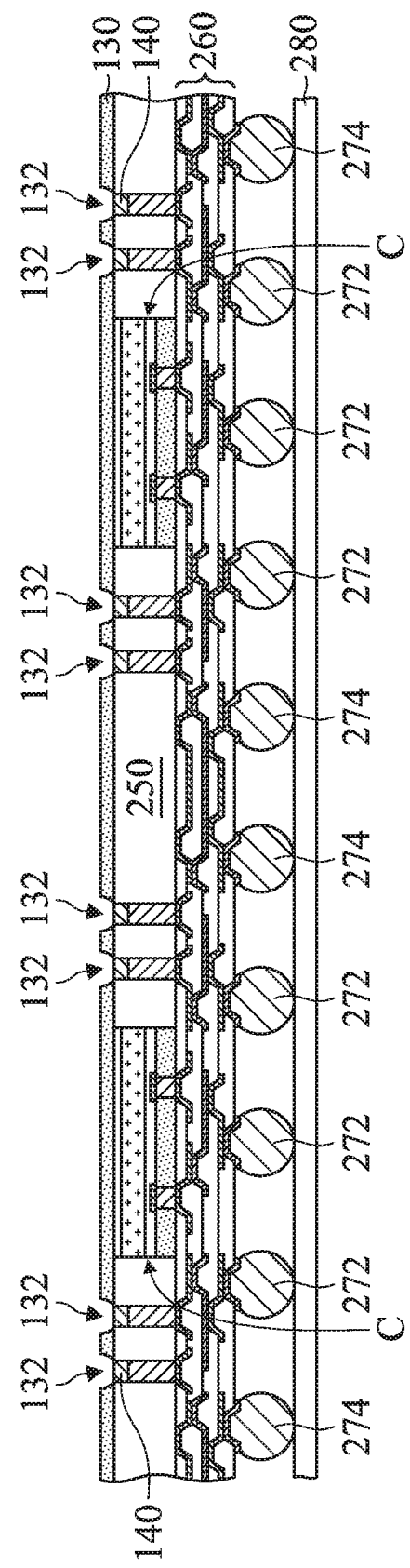

As shown in FIG. 1K, portions of the buffer layer 130 are removed to form openings 132 in the buffer layer 130, in accordance with some embodiments. The openings 132 expose the conductive layer 140, in accordance with some embodiments. The removal process includes a laser drilling process, or a photolithography process and an etching process, in accordance with some embodiments.

Figure 1L:
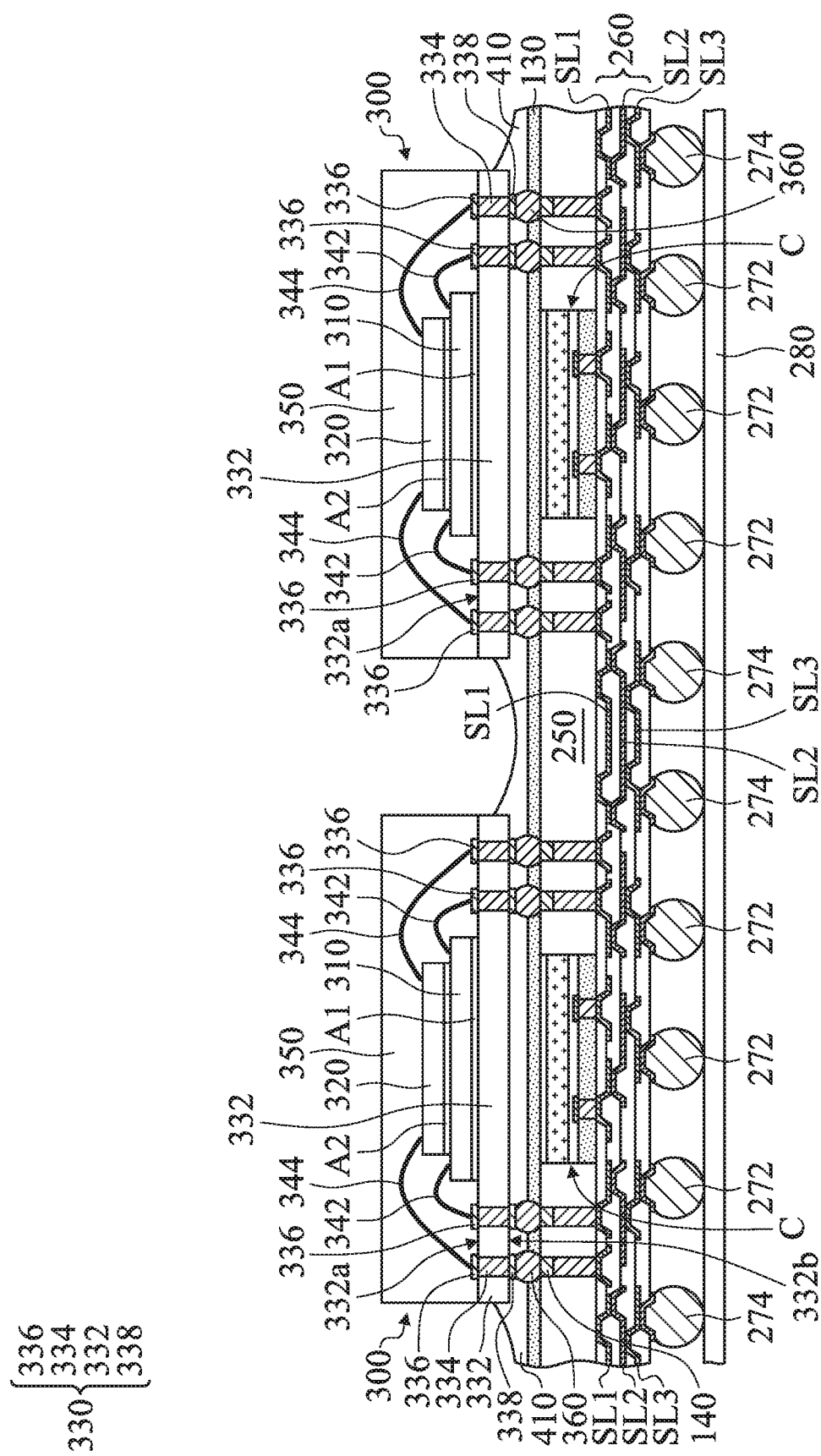

As shown in FIG. 1L, chip packages 300 are disposed over the chip structures C and the molding compound layer 250 to bond with the conductive layer 140, in accordance with some embodiments. Each of the chip packages 300 includes chips 310 and 320, a substrate 330, conductive wires 342 and 344, a molding compound layer 350, and conductive bumps 360, in accordance with some embodiments.

The chips 310 and 320 are disposed over the substrate 330, in accordance with some embodiments. The chip 310 is bonded to the substrate 330 through an adhesive layer A1 therebetween, in accordance with some embodiments. The chip 320 is bonded to the chip 310 through an adhesive layer A2 therebetween, in accordance with some embodiments.

The substrate 330 includes a dielectric layer 332, conductive via structures 334, and bonding pads 336 and 338, in accordance with some embodiments. The dielectric layer 332 may have dielectric films (not shown) stacked on each other. The dielectric layer 332 has opposite surfaces 332a and 332b, in accordance with some embodiments. The conductive via structures 334 pass through the dielectric layer 332, in accordance with some embodiments.

The bonding pads 336 are positioned over the surface 332a, in accordance with some embodiments. The bonding pads 336 are positioned over the respective conductive via structures 334 to electrically connect to the respective conductive via structures 334, in accordance with some embodiments. The bonding pads 338 are positioned over the surface 332b, in accordance with some embodiments. The bonding pads 338 are positioned under the respective conductive via structures 334 to electrically connect to the respective conductive via structures 334, in accordance with some embodiments.

The conductive wires 342 physically and electrically connect the chip 310 to the bonding pads 336, in accordance with some embodiments. The conductive wires 344 physically and electrically connect the chip 320 to the bonding pads 336, in accordance with some embodiments. The molding compound layer 350 is molded over the chips 310 and 320, the conductive wires 342 and 344, and the substrate 330, in accordance with some embodiments.

The molding compound layer 350 is configured to protect the chips 310 and 320 and the conductive wires 342 and 344 from damage and contamination during subsequent processes, in accordance with some embodiments. The molding compound layer 350 includes a polymer material, in accordance with some embodiments.

The chip package 300 shown in FIG. 1L is an example. The chip package 300 is not limited to the type of the chip package 300 shown in FIG. 1L. That is, the chip packages 300 may be any suitable type of chip package. For example, the chip package 300 includes a chip surrounded by a molding compound layer, an underfill layer, a polymer layer, and/or the like. The chip package 300 includes a package-on-package (PoP) type semiconductor package, a multi-chip stacked package, a chip package including chips stacked on a substrate, a chip package including only one chip, or another suitable type of chip package.

The conductive bumps 360 connect the bonding pads 338 to the conductive layer 140, in accordance with some embodiments. As shown in FIG. 1L, an underfill layer 410 is filled between the substrate 330 and the buffer layer 130, in accordance with some embodiments. The underfill layer 410 includes a polymer material, in accordance with some embodiments.

Figure 1M:
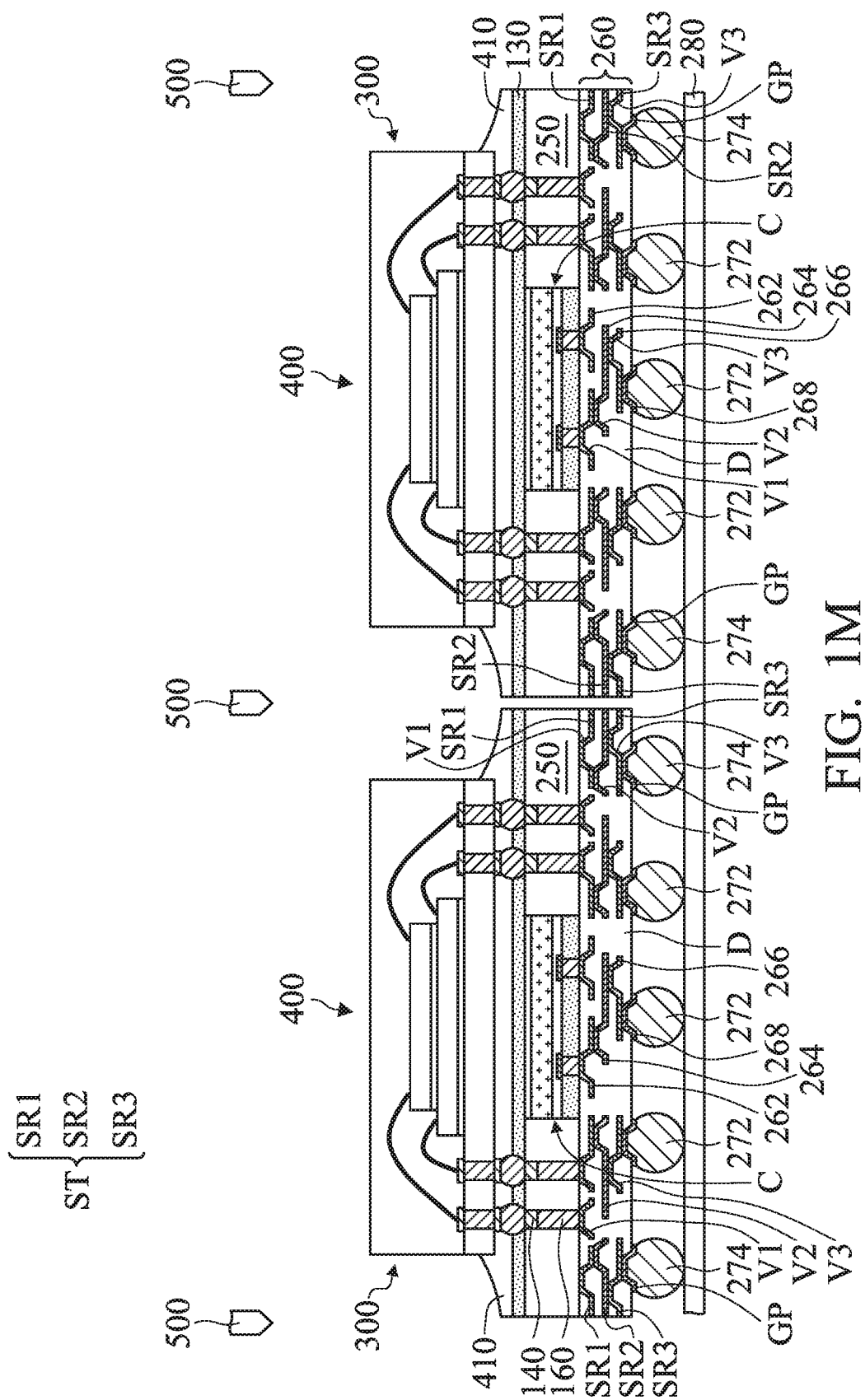
FIG. 1M-1 is a bottom view of the redistribution structure 260 and the conductive bumps, and the grounding bumps in FIG. 1M, in accordance with some embodiments.

As shown in FIG. 1M, a mechanical singulation process is performed over the underfill layer 410 and the buffer layer 130 between the chip packages 300, the molding compound layer 250 between the chip structures C, and the redistribution structure 260, in accordance with some embodiments. The mechanical singulation process is performed using cutting knives 500, in accordance with some embodiments.

As shown in FIGS. 1L and 1M, the mechanical singulation process cuts through the underfill layer 410, the buffer layer 130, the molding compound layer 250, the dielectric structure D, and the seal layers SL1, SL2, and SL3 so as to form individual chip package structures 400, in accordance with some embodiments.

Each of the chip package structures 400 includes the chip packages 300, the chip structure C, and portions of the molding compound layer 250, the dielectric structure D, the seal layers SL1, SL2, and SL3, the redistribution lines 262, 264, and 266, the pads 268, the grounding pads GP, the conductive bumps 272, the grounding bumps 274, the conductive layer 140, and the conductive via structures 160, V1, V2, and V3, in accordance with some embodiments.

Figure 1N:
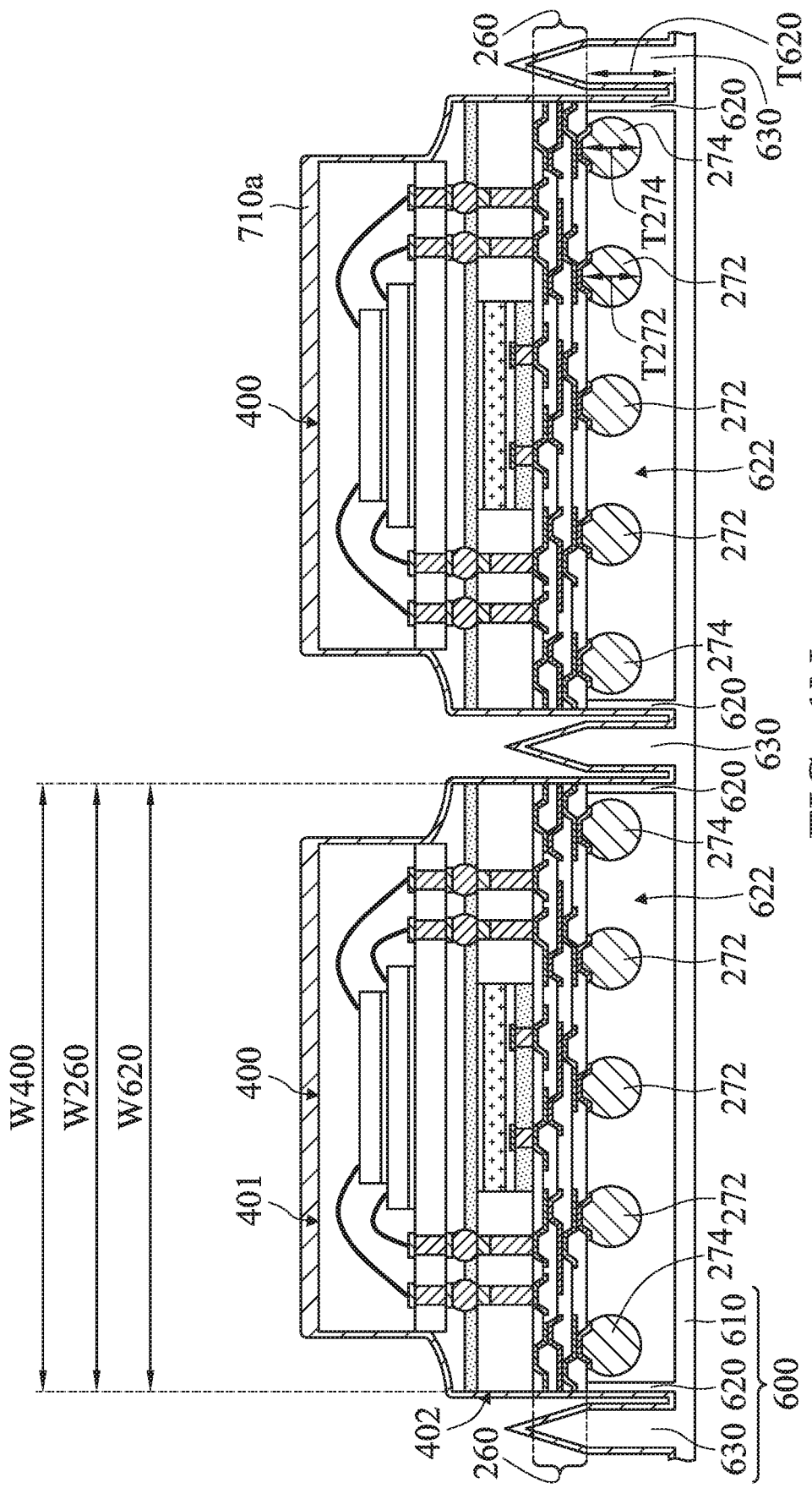
Figures 1, 1N:
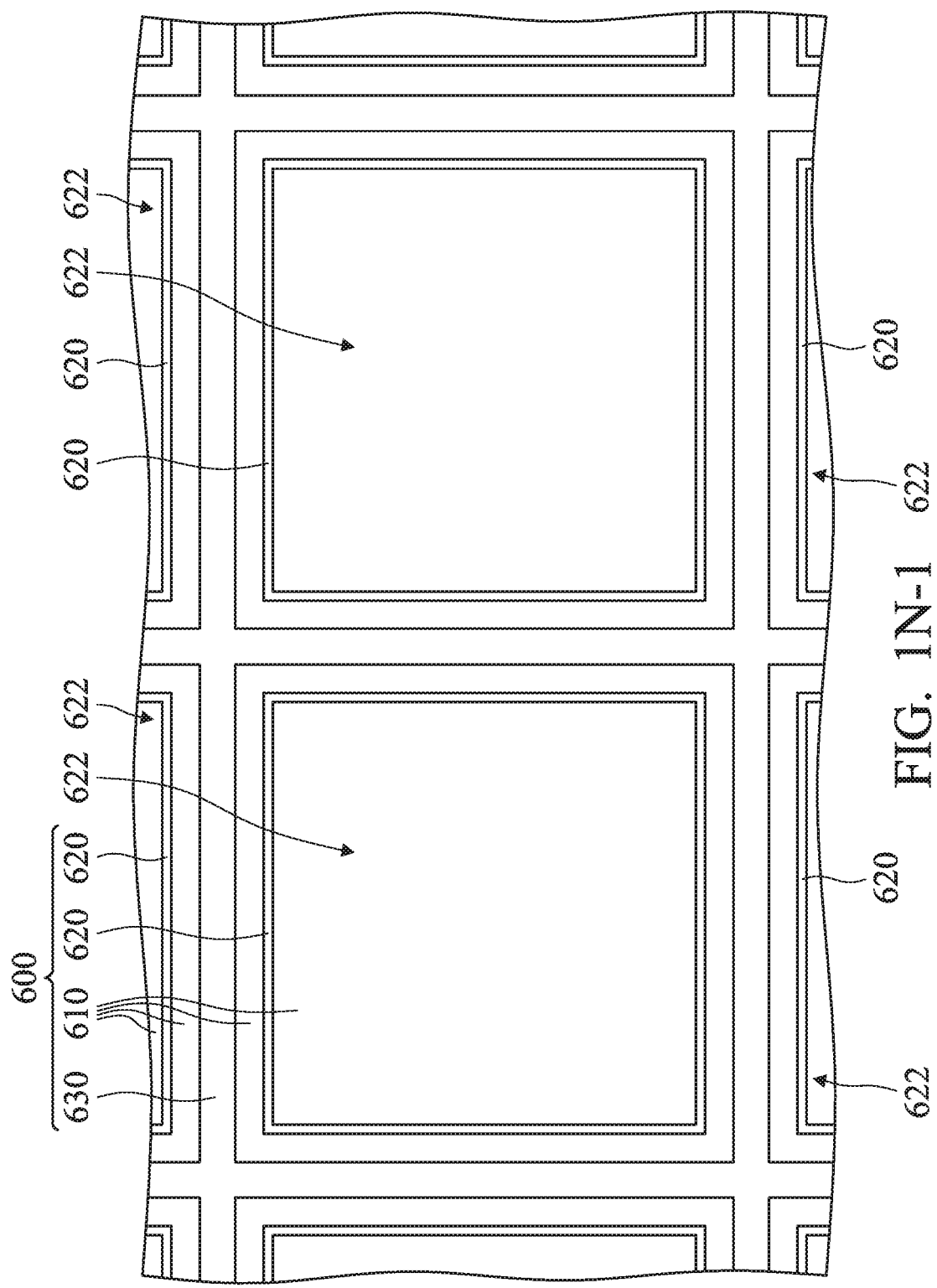

FIG. 1M-1 is a bottom view of the redistribution structure 260 and the conductive bumps 272, and the grounding bumps 274 in FIG. 1M, in accordance with some embodiments. As shown in FIGS. 1M and 1M-1, after the mechanical singulation process, the seal layers SL1 are cut into seal rings SR1, the seal layers SL2 are cut into seal rings SR2, and the seal layers SL3 are cut into seal rings SR3, in accordance with some embodiments. In each of the chip package structures 400, the seal rings SR1, SR2, and SR3 together form a seal ring structure ST, in accordance with some embodiments.

The seal ring structure ST is configured to protect the redistribution lines 262, 264, and 266, and the dielectric structure D from being damaged during the mechanical singulation process and from moisture degradation. In some embodiments, the seal ring structure ST further includes the conductive via structures V1, V2, and V3 connected to the seal rings SR1, SR2, and SR3. The grounding bumps 274 are projectively overlapping with (or right below) the seal ring structure ST, in accordance with some embodiments. That is, the seal ring structure ST are overlapped with the grounding bumps 274.

Therefore, the size (e.g., the area) of the redistribution structure 260 with the seal ring structure ST overlapped with the grounding bumps 274 is less than that of a redistribution structure with a seal ring structure, which are not overlapped with grounding bumps.

The seal rings SR2 and SR3 are between the seal ring SR1 and the grounding bump 274, in accordance with some embodiments. In some embodiments, the grounding bumps 274 are projectively overlapping with (or right below) all of the seal rings SR1, SR2, and SR3. The grounding bumps 274 are projectively overlapping with (or right below) the conductive via structures V2, in accordance with some embodiments.

FIG. 1N-1 is a top view of a tray in FIG. 1N, in accordance with some embodiments. As shown in FIGS. 1N and 1N-1, the chip package structures 400 are disposed over a tray 600, in accordance with some embodiments. The tray 600 includes a substrate 610, support frame structures 620, and a spacer structure 630, in accordance with some embodiments.

The support frame structures 620 are disposed over the substrate 610 and spaced from each other, in accordance with some embodiments. The support frame structures 620 are arranged in an array, in accordance with some embodiments. Each of the support frame structures 620 has an opening 622 exposing the substrate 610, in accordance with some embodiments.

In some embodiments, a width W620 of the support frame structure 620 is substantially equal to a width W400 of the chip package structure 400. In some embodiments, the width W620 of the support frame structure 620 is substantially equal to a width W260 of the redistribution structure 260. In some embodiments, a thickness T620 of the support frame structure 620 is greater than a thickness T274 of the grounding bump 274 (or a thickness T272 of the conductive bump 272).

The support frame structure 620 has a top view shape corresponding to the top view shape of the chip package structure 400 (or the redistribution structure 260) over the support frame structure 620, in accordance with some embodiments. For example, the chip package structure 400 has a square shape, and the support frame structure 620 also has a square shape. The support frame structure 620 has a rectangular shape, a diamond shape, or another suitable shape.

The spacer structure 630 is disposed over the substrate 610 and between the support frame structures 620, in accordance with some embodiments. The spacer structure 630 is spaced from the support frame structures 620, in accordance with some embodiments. The substrate 610, the support frame structures 620, and the spacer structure 630 are made of the same material, such as metal, ceramic, alloy (e.g., stainless steel or Al alloy), or polymer, in accordance with some embodiments. The support frame structures 620 include a metal material, a polymer material (e.g., epoxy or rubber), a ceramic material, in accordance with some embodiments. The support frame structure 620 has a top view shape of a rectangle, a square, a polygon, or another suitable shape.

The chip package structures 400 are disposed over the respective support frame structures 620, in accordance with some embodiments. The conductive bumps 272 and the grounding bumps 274 of the chip package structure 400 are in the opening 622 of the support frame structure 620 under the chip package structure 400, in accordance with some embodiments. The conductive bumps 272 and the grounding bumps 274 are in a closed space (i.e., the opening 622) formed by the redistribution structure 260, the support frame structure 620, and the substrate 610, in accordance with some embodiments.

As shown in FIG. 1N, a conductive shielding material layer 710a is formed over the chip package structures 400 and the tray 600, in accordance with some embodiments. The conductive shielding material layer 710a conformally covers the chip package structures 400 and the tray 600, in accordance with some embodiments. The conductive shielding material layer 710a conformally covers a top surface 401 and sidewalls 402 of each of the package structures 400, in accordance with some embodiments.

The conductive shielding material layer 710a includes a metal material, such as copper, titanium, stainless steel, Fe—Ni alloy, iron, aluminum, nickel, silver, gold, chromium, or Ti—W alloy. The formation of the conductive shielding material layer 710a includes a deposition process, such as a physical vapor deposition process, a chemical vapor deposition process (e.g. an atmospheric pressure plasma chemical vapor deposition process), or a spray (jetting) process, in accordance with some embodiments. In some embodiments, the formation of the conductive shielding material layer 710a includes a plating process, such as an electroless plating process.

As shown in FIG. 1O, the tray 600 is removed, in accordance with some embodiments. In this step, chip package structures 800 are substantially formed, in accordance with some embodiments. For the sake of simplicity, FIG. 1O only shows one of the chip package structures 800.

After the removal of the tray 600, the conductive shielding material layer 710a remaining over the chip package structure 400 forms a conductive shielding film 710, in accordance with some embodiments. The conductive shielding film 710 is configured as an electromagnetic interference (EMI) shield film, in accordance with some embodiments. Each of the chip package structures 800 includes the chip package structure 400 and the conductive shielding film 710, in accordance with some embodiments.

The redistribution structure 260 has sidewalls 269a, a top surface 269b, and a bottom surface 269c opposite to the top surface 269b, in accordance with some embodiments. The chip structure C is formed over the top surface 269b, in accordance with some embodiments. The conductive bumps 272 and the ground bumps 274 are formed over the bottom surface 269c, in accordance with some embodiments. The conductive shielding film 710 covers the chip structure C, the top surface 269b, and the sidewalls 269a, in accordance with some embodiments. The conductive shielding film 710 does not cover the bottom surface 269c, in accordance with some embodiments.

The conductive shielding film 710 is electrically connected to the seal ring structure ST, in accordance with some embodiments. The conductive shielding film 710 is electrically connected to the grounding bumps 274 through the seal ring structure ST and the grounding pads GP, in accordance with some embodiments.

The conductive shielding film 710 is in direct contact with the seal ring structure ST, the dielectric structure D, the molding compound layer 250, the buffer layer 130, the underfill layer 410, and the molding compound layer 350, in accordance with some embodiments. The conductive shielding film 710 conformally covers the seal ring structure ST, the dielectric structure D, the molding compound layer 250, the buffer layer 130, the underfill layer 410, and the molding compound layer 350, in accordance with some embodiments.

FIG. 1O-1 is an enlarged cross-sectional view of a region R of FIG. 1O, in accordance with some embodiments. As shown in FIGS. 1O and 1O-1, sidewalls S1, S2, S3, S4, and 252 of the seal rings SR1, SR2, and SR3, the dielectric structure D, and the molding compound layer 250 are substantially coplanar with each other, in accordance with some embodiments. The dielectric structure D does not cover the sidewalls S1, S2, S3, in accordance with some embodiments. The conductive shielding film 710 conformally covers and is in direct contact with the sidewalls S1, S2, S3, S4, and 252, in accordance with some embodiments.

As shown in FIGS. 1N and 1O, when the conductive shielding material layer 710a is formed using a deposition process (e.g., a physical vapor deposition process), a thickness T1 of the conductive shielding film 710 (or the conductive shielding material layer 710a) covering the top surface 401 is greater than a thickness T2 of the conductive shielding film 710 covering the sidewalls 402, in accordance with some embodiments.

Figure 10:
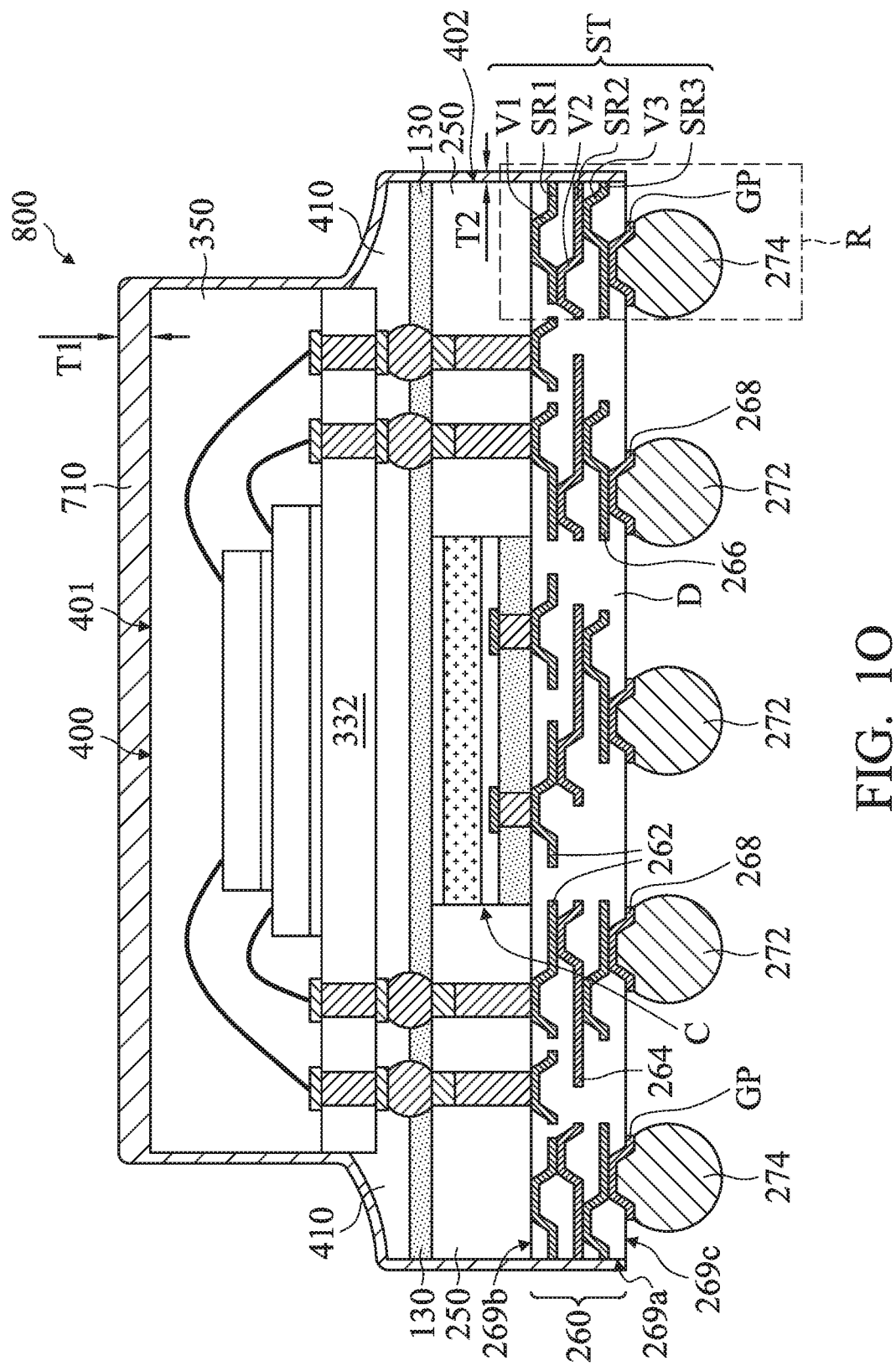
Figures 1, 10:
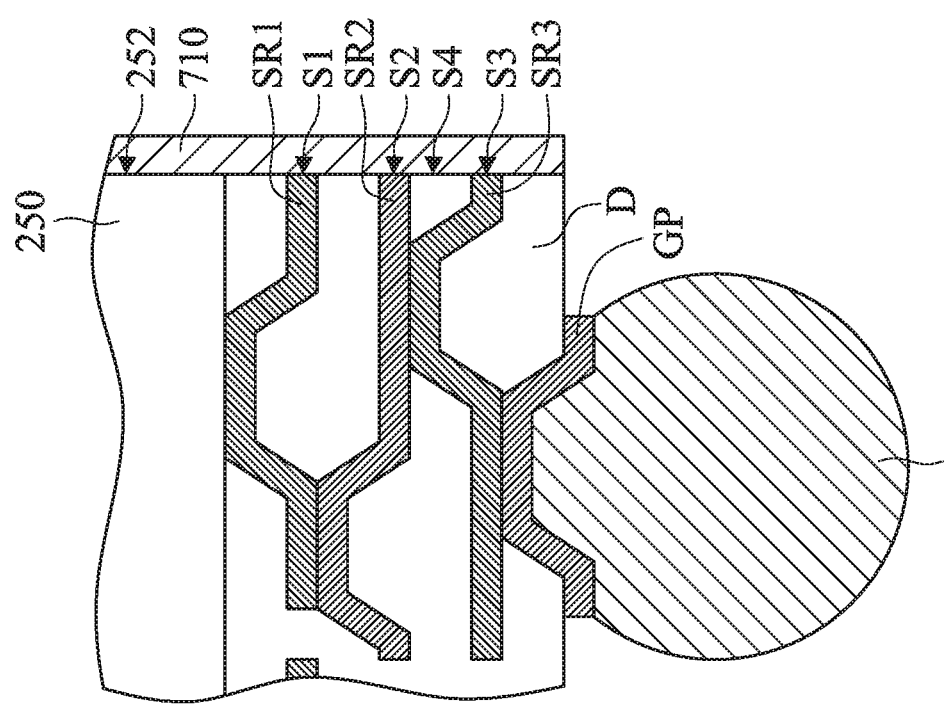
Figures 2, 10:
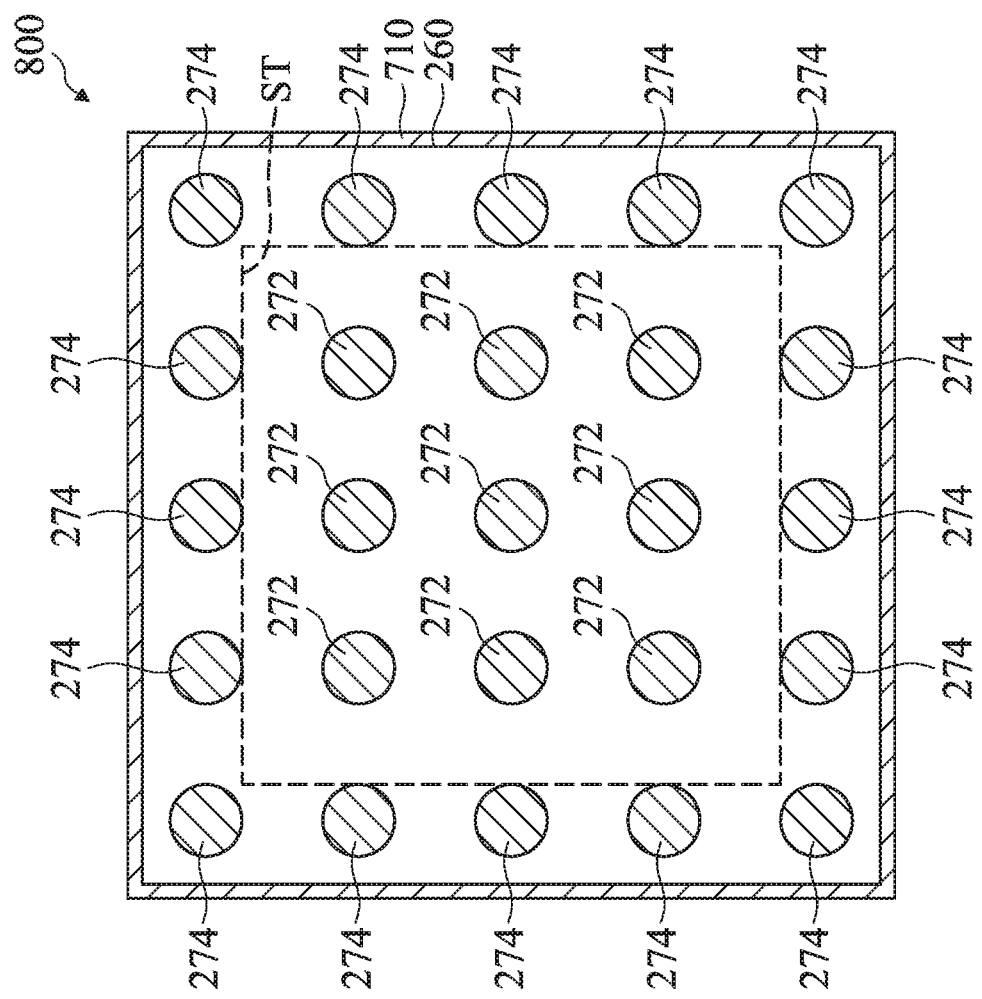

FIG. 1O-2 is a bottom view of the chip package structure 800 in FIG. 1O, in accordance with some embodiments. As shown in FIGS. 1O and 1O-2, the seal ring structure ST (or the seal ring SR1, SR2, or SR3) is a continuous ring structure, in accordance with some embodiments. The conductive shielding film 710, the seal ring structure ST, and the ground bumps 274 are electrically insulated from the redistribution lines 262, 264, and 266, the conductive bumps 272, and the chip structure C, in accordance with some embodiments.

As shown in FIGS. 1O and 1O-2, all of the grounding bumps 274 are projectively overlapping with (or right below) the seal ring structure ST (or all of the seal rings SR1, SR2, and SR3), in accordance with some embodiments. Therefore, the size (e.g., the area) of the redistribution structure 260 with the seal ring structure ST overlapped with the grounding bumps 274 is reduced. As a result, the size of the chip package structure 800 is reduces as well.

Figure 2A:
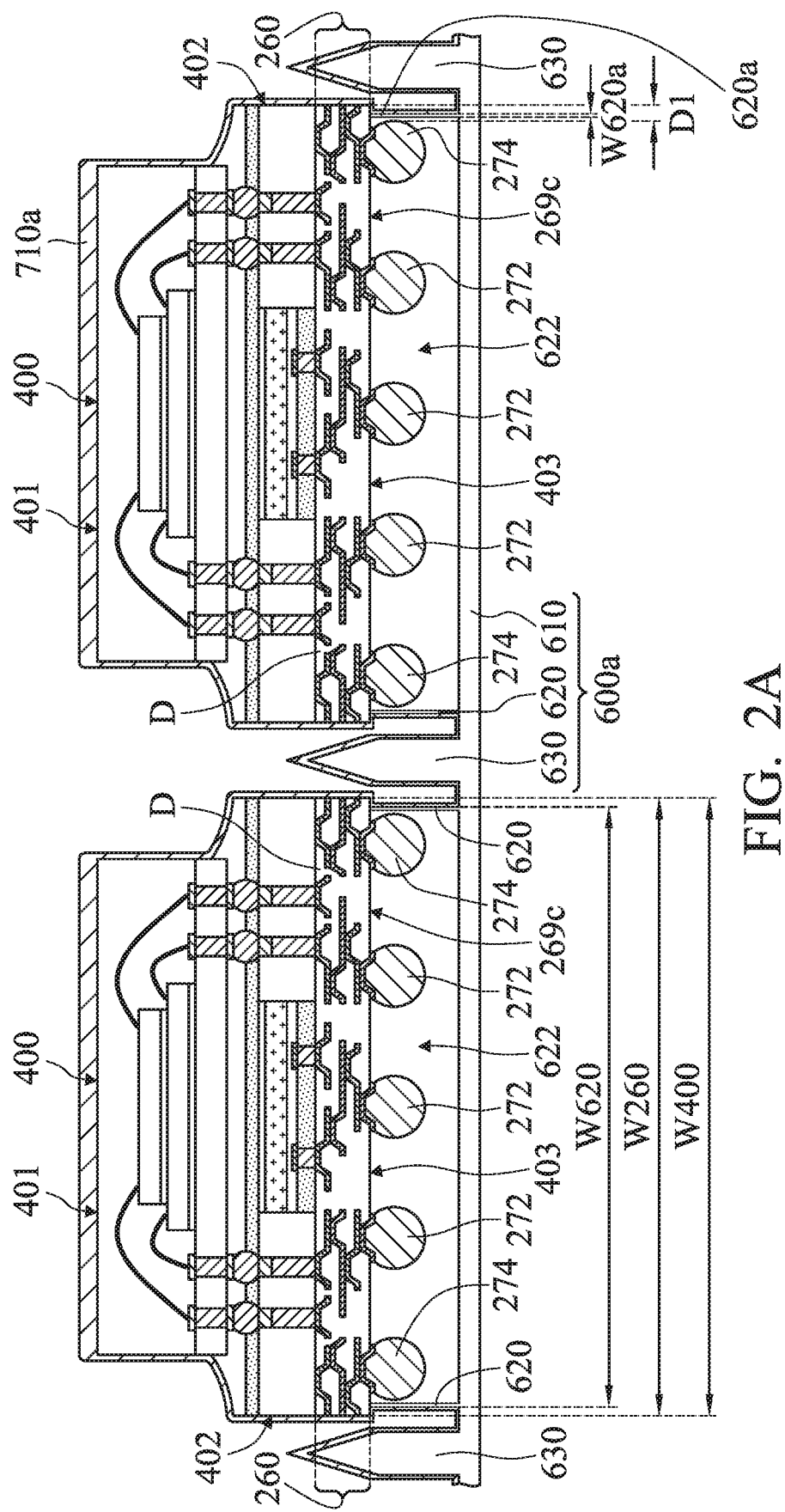
FIGS. 2A-2B are cross-sectional views of various stages of a process for forming a chip package structure, in accordance with some embodiments.
Figure 2B:
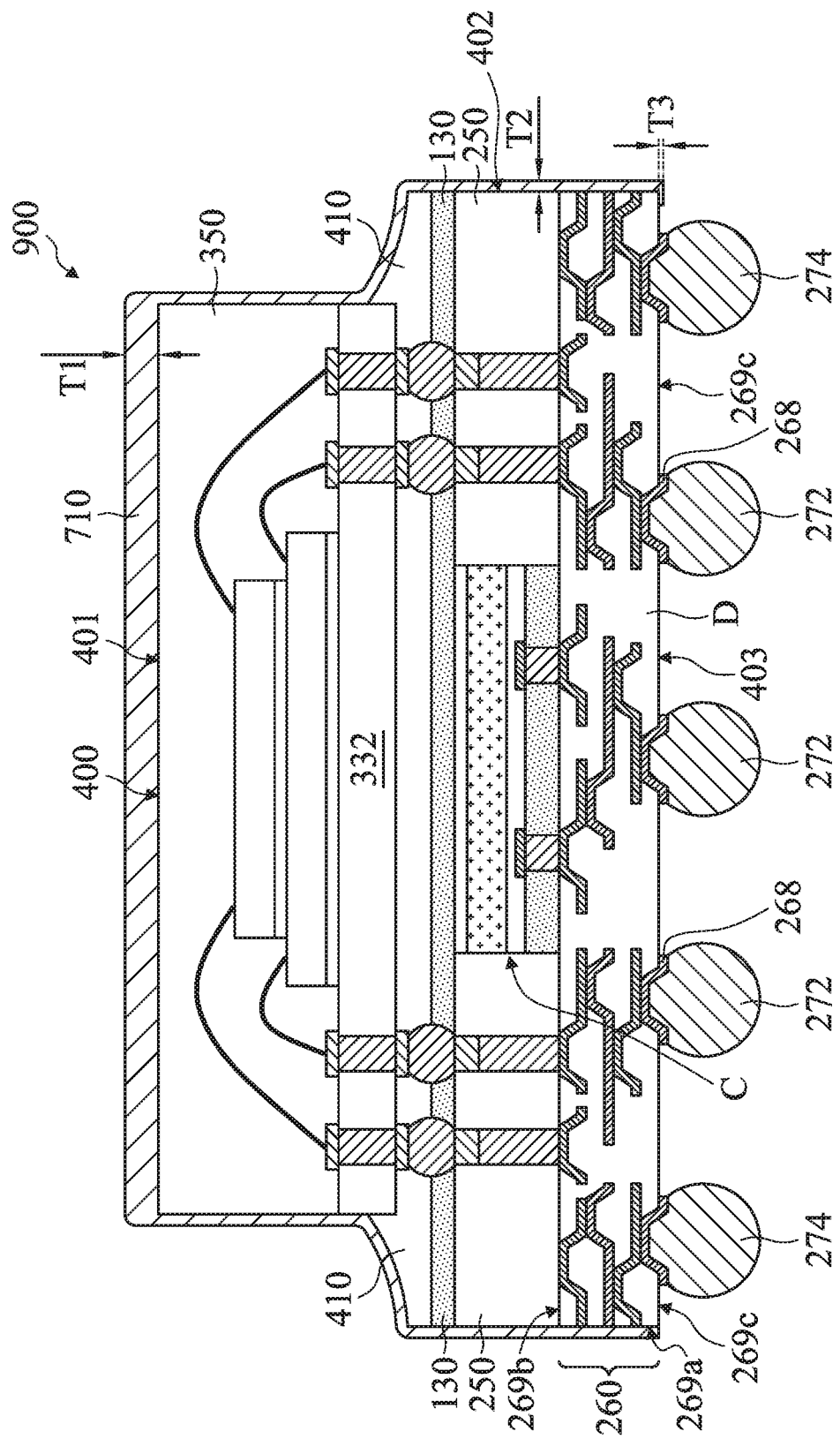
Figures 1, 2B:
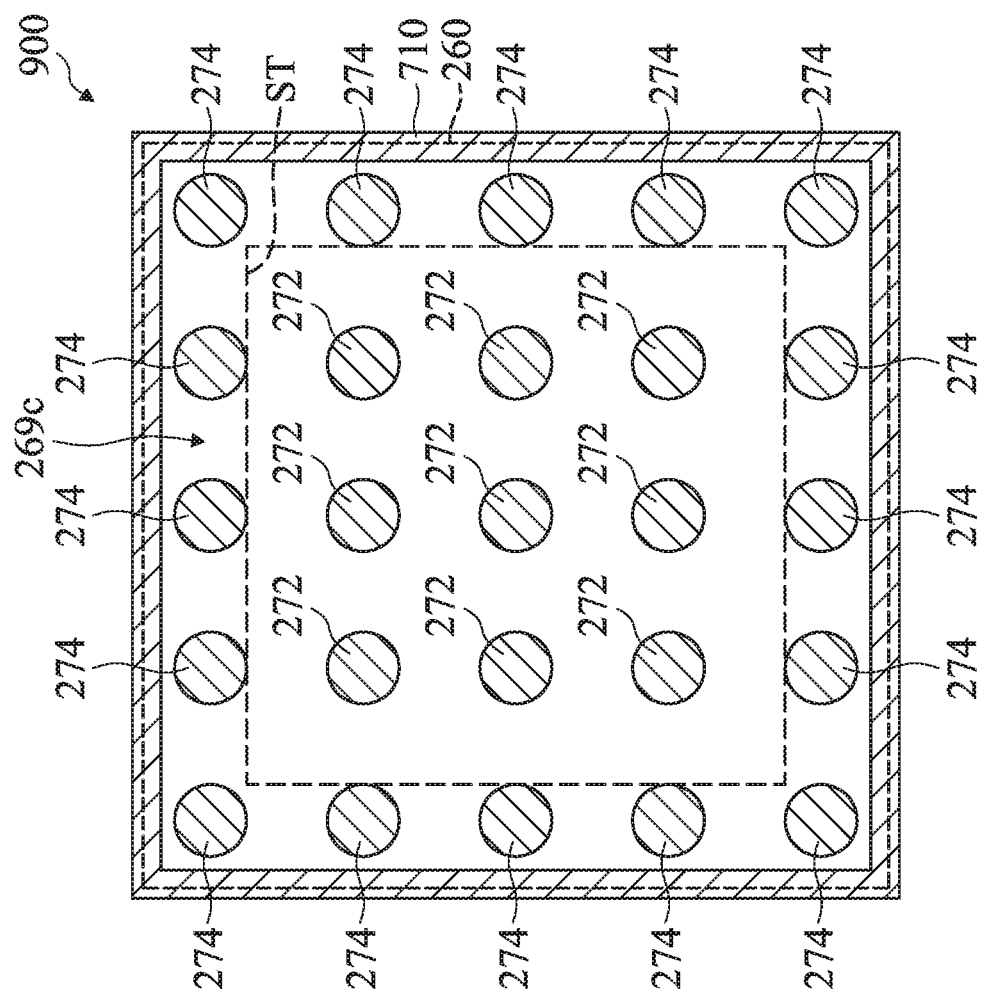

FIGS. 2A-2B are cross-sectional views of various stages of a process for forming a chip package structure 900, in accordance with some embodiments. After the steps of FIGS. 1A-1M, as shown in FIG. 2A, the chip package structures 400 are disposed over a tray 600a, in accordance with some embodiments. The tray 600a is similar to the tray 600, except that the width W620 of the support frame structure 620 of the tray 600a is less than the width W400 of the chip package structure 400 (or the width W260 of the redistribution structure 260), in accordance with some embodiments. Therefore, a peripheral portion of the bottom surface 269c is outside of the opening 622 of the support frame structure 620, in accordance with some embodiments.

As shown in FIG. 2A, a conductive shielding material layer 710a is formed over the chip package structures 400 and the tray 600a, in accordance with some embodiments. The conductive shielding material layer 710a conformally covers the chip package structures 400 and the tray 600a, in accordance with some embodiments.

The conductive shielding material layer 710a conformally covers the top surface 401, the sidewalls 402, and a bottom surface 403 of each of the package structures 400, in accordance with some embodiments. The conductive shielding material layer 710a conformally covers the peripheral portion of the bottom surface 269c of the redistribution structure 260 of each of the package structures 400, in accordance with some embodiments.

The support frame structure 620 has an upper portion 620a, in accordance with some embodiments. The upper portion 620a is in direct contact with the redistribution structure 260, in accordance with some embodiments. The upper portion 620a has a width W620a. In some embodiments, the width W620a is less than a distance D1 between the grounding bump 274 and the sidewall 402 of the package structure 400 (or the package die edge).

As shown in FIG. 2B, the tray 600a is removed, in accordance with some embodiments. In this step, chip package structures 900 are substantially formed, in accordance with some embodiments. For the sake of simplicity, FIG. 2B only shows one of the chip package structures 900.

After the removal of the tray 600a, the conductive shielding material layer 710a remaining over the chip package structure 400 forms a conductive shielding film 710, in accordance with some embodiments. Each of the chip package structures 900 includes the chip package structure 400 and the conductive shielding film 710, in accordance with some embodiments.

As shown in FIGS. 2A and 2B, during the formation of the conductive shielding material layer 710a, since the shielding of the redistribution structure 260, the conductive shielding film 710 (or the conductive shielding material layer 710a) over the bottom surface 403 has a thickness T3 less than the thickness T2 of the conductive shielding film 710 over the sidewalls 402, in accordance with some embodiments. The thickness T2 ranges from about 0.05 μm to about 50 μm, in accordance with some embodiments.

Since the thickness T3 is very small, the separation of the conductive shielding material layer 710a over the bottom surface 403 and the conductive shielding material layer 710a over the support frame structure 620 is easy and does not damage the conductive shielding material layer 710a remaining over the bottom surface 403, in accordance with some embodiments.

FIG. 2B-1 is a bottom view of the chip package structure 900 in FIG. 2B, in accordance with some embodiments. As shown in FIGS. 2B and 2B-1, the conductive shielding film 710 covers the peripheral portion of the bottom surface 269c of the redistribution structure 260, in accordance with some embodiments.

The conductive shielding film 710 covering the bottom surface 269c continuously surrounds the conductive bumps 272 and the grounding bumps 274, in accordance with some embodiments. The conductive shielding film 710 is spaced apart from the conductive bumps 272 and the grounding bumps 274, in accordance with some embodiments.

Figure 3A:
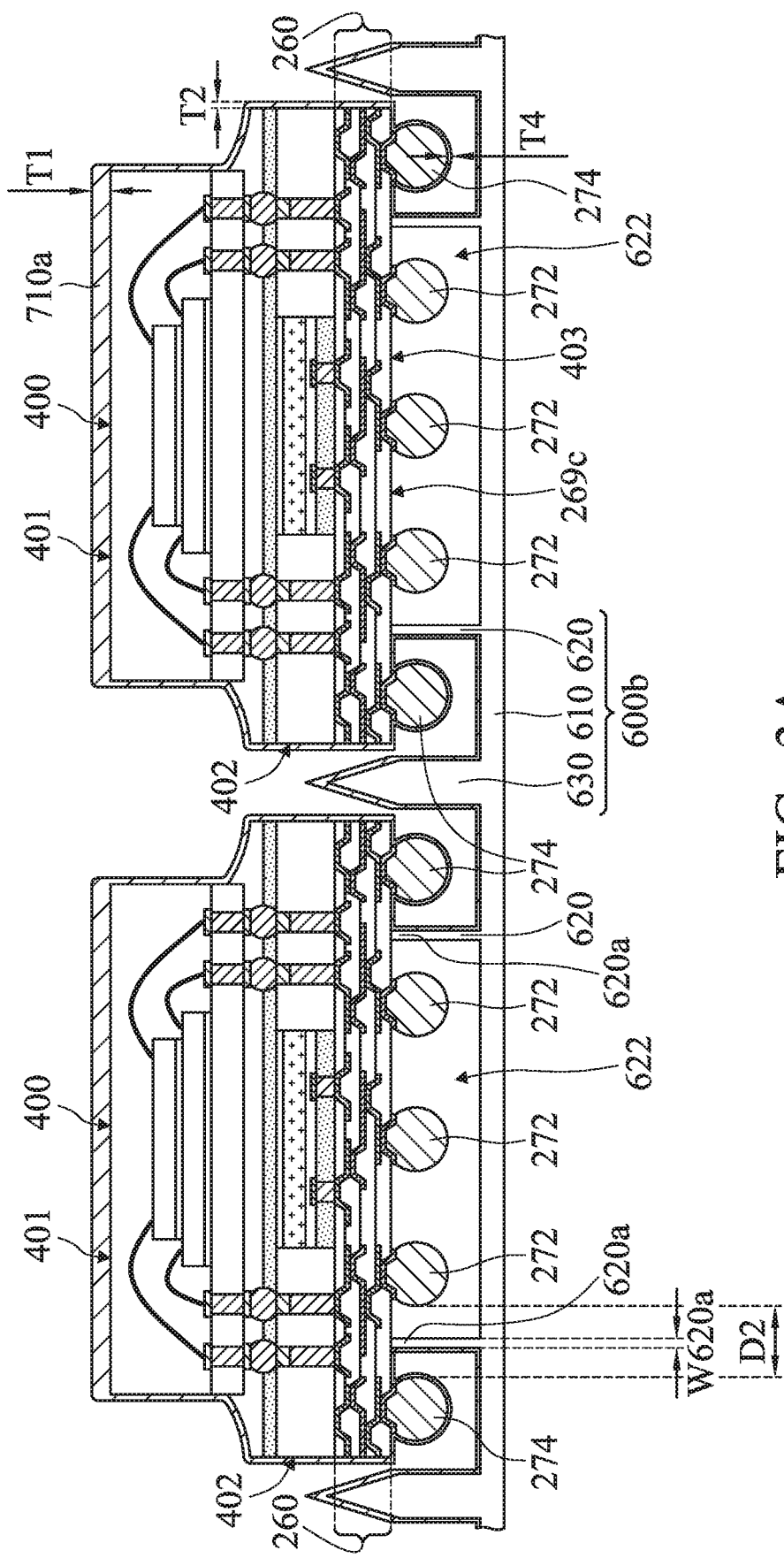
FIGS. 3A-3B are cross-sectional views of various stages of a process for forming a chip package structure, in accordance with some embodiments.
Figure 3B:
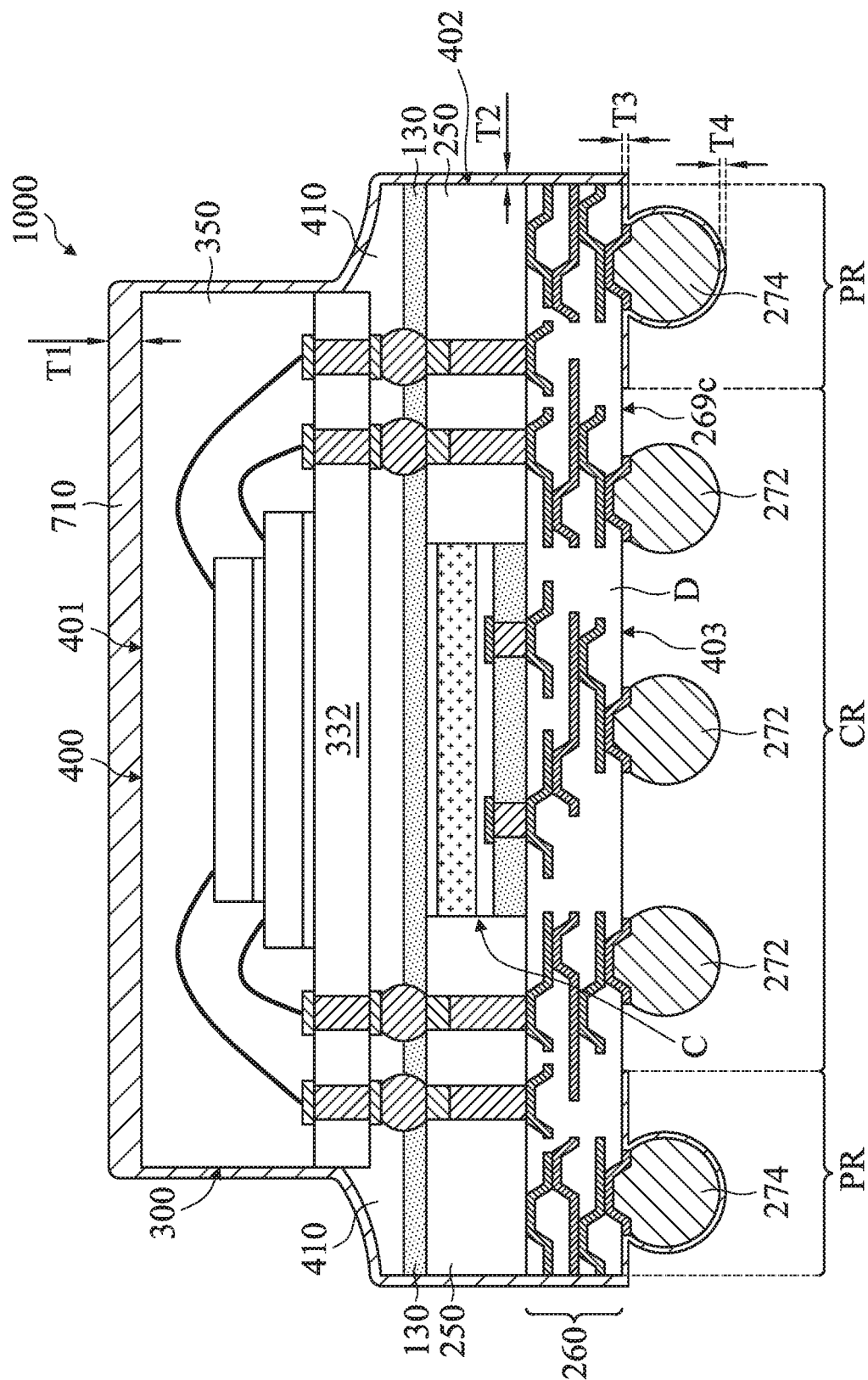
Figures 1, 3B:
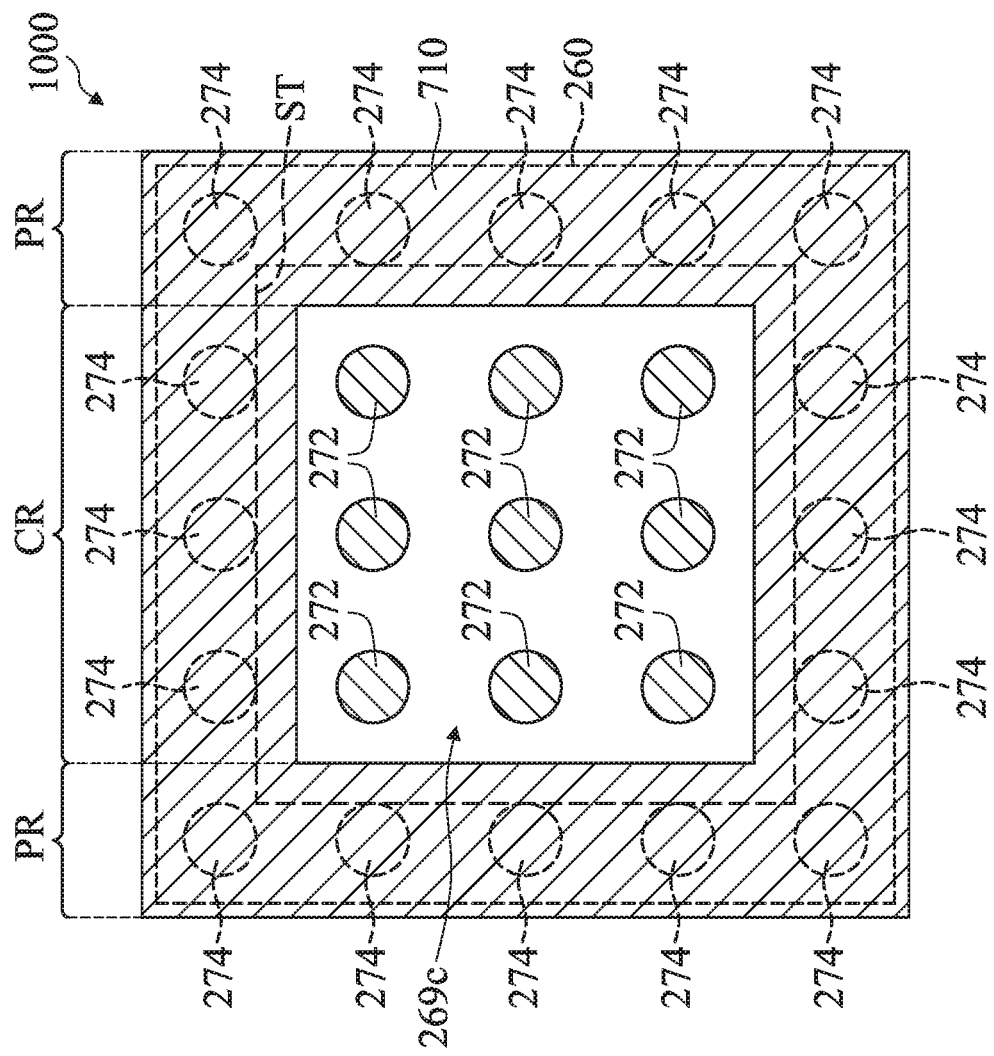

FIGS. 3A-3B are cross-sectional views of various stages of a process for forming a chip package structure 1000, in accordance with some embodiments. After the steps of FIGS. 1A-1M, as shown in FIG. 3A, the chip package structures 400 are disposed over a tray 600b, in accordance with some embodiments.

The tray 600b is similar to the tray 600a, except that the support frame structure 620 of the tray 600b is between the conductive bumps 272 and the grounding bumps 274, in accordance with some embodiments. The support frame structure 620 only surrounds the conductive bumps 272, and the grounding bumps 274 are outside of the opening 622 of the support frame structure 620, in accordance with some embodiments. The conductive bumps 272 are in a closed space (i.e., the opening 622) formed by the redistribution structure 260, the support frame structure 620, and the substrate 610, in accordance with some embodiments.

The support frame structure 620 has an upper portion 620a, in accordance with some embodiments. The upper portion 620a is in direct contact with the redistribution structure 260, in accordance with some embodiments. The upper portion 620a has a width W620a less than a distance D2 between the ground bump 274 and the conductive bump 272 adjacent to the ground bump 274, in accordance with some embodiments. The width W620a ranges from about 40 μm to about 500 μm, in accordance with some embodiments.

As shown in FIG. 3A, a conductive shielding material layer 710a is formed over the chip package structures 400 and the tray 600b, in accordance with some embodiments. The conductive shielding material layer 710a conformally covers the chip package structures 400 and the tray 600b, in accordance with some embodiments.

The conductive shielding material layer 710a conformally covers the top surface 401, the sidewalls 402, the bottom surface 403, and the grounding bumps 274 of each of the package structures 400, in accordance with some embodiments.

Figure 4:
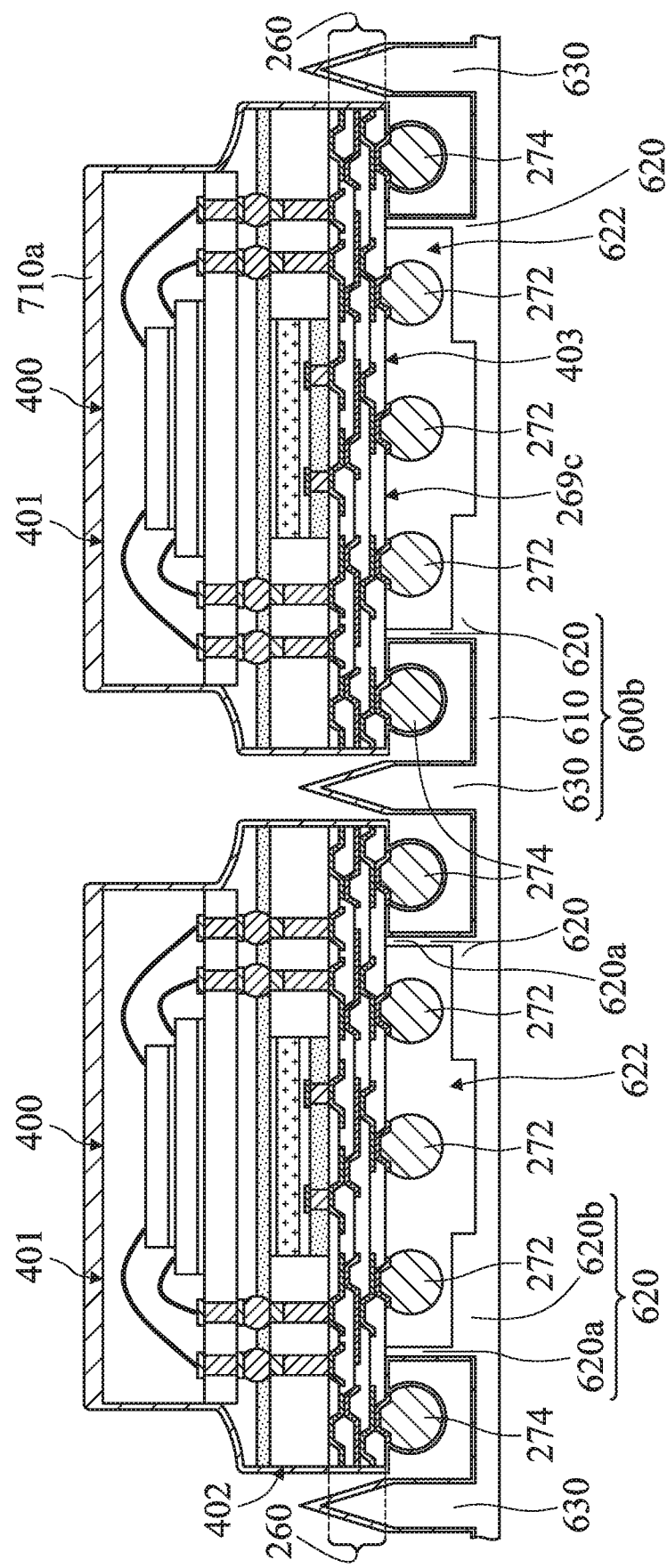
FIG. 4 is a cross-sectional view of a stage of a process for forming a chip package structure, in accordance with some embodiments.
Figure 5:
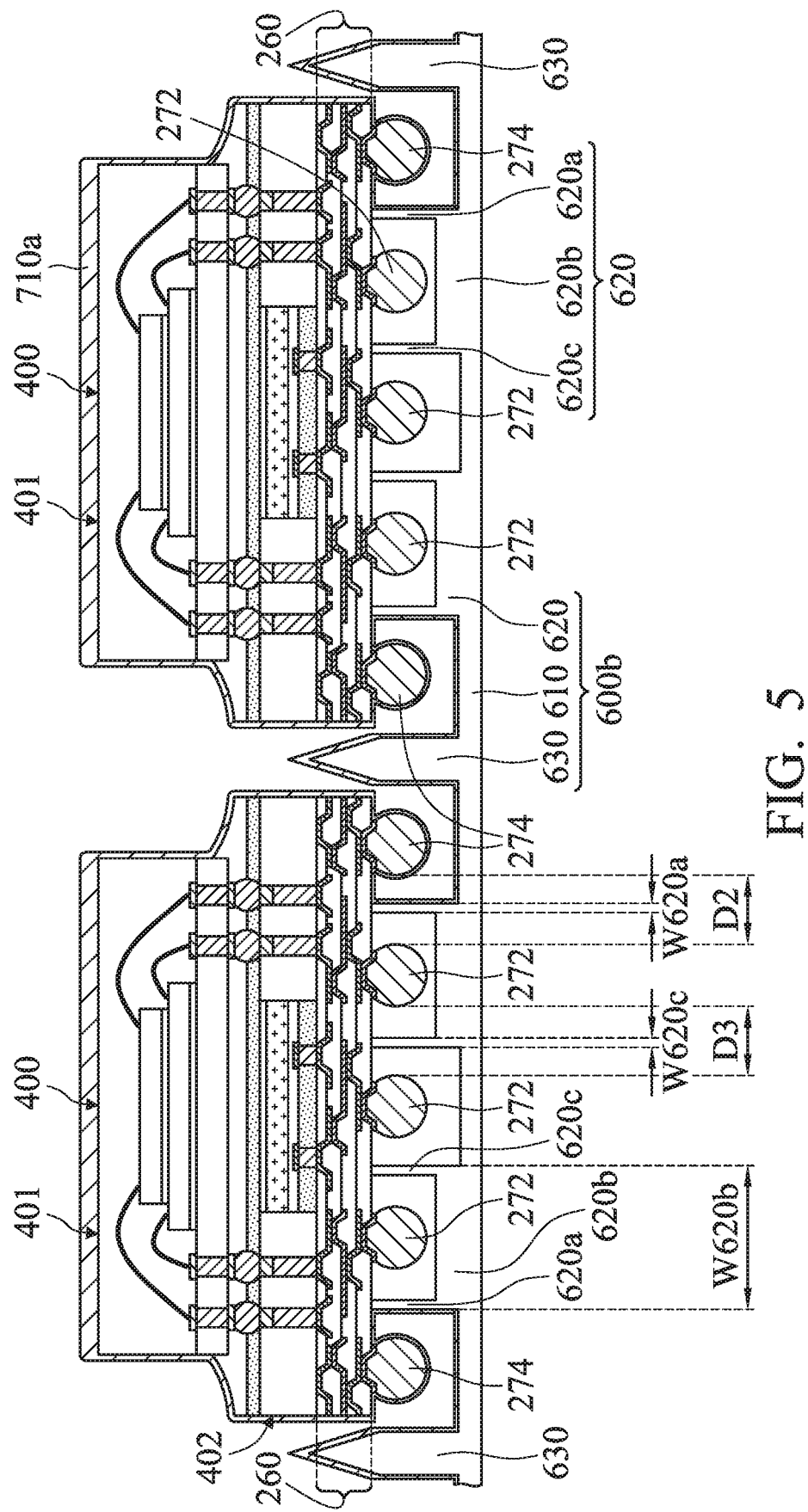
FIG. 5 is a cross-sectional view of a stage of a process for forming a chip package structure, in accordance with some embodiments.

The support frame structure 620 may have various cross-sectional shapes, such as an L shape (as shown in FIG. 4) or a U shape (as shown in FIG. 5). As shown in FIG. 4, the support frame structure 620 has an upper portion 620a and a lower portion 620b, in accordance with some embodiments. The lower portion 620b is wider than the upper portion 620a, in accordance with some embodiments.

As shown in FIG. 5, the support frame structure 620 has upper portions 620a and 620c and a lower portion 620b, in accordance with some embodiments. The upper portions 620a and 620c are over the lower portion 620b and spaced apart from each other, in accordance with some embodiments. The upper portion 620a is between the grounding bumps 274 and the conductive bumps 272 adjacent to the grounding bumps 274, in accordance with some embodiments. The upper portion 620c is between two adjacent conductive bumps 272, in accordance with some embodiments.

The upper portions 620a and 620c are in direct contact with the redistribution structure 260, in accordance with some embodiments. The upper portion 620a has a width W620a less than a distance D2 between the ground bump 274 and the conductive bump 272 adjacent to the ground bump 274, in accordance with some embodiments. The upper portion 620c has a width W620c less than a distance D3 between the two adjacent conductive bumps 272, in accordance with some embodiments. The distance D2 is equal to the distance D3, in accordance with some embodiments. The lower portion 620b has a width W620b greater than or equal to the distance D2 or D3, in accordance with some embodiments.

As shown in FIG. 3B, the tray 600b is removed, in accordance with some embodiments. In this step, chip package structures 1000 are substantially formed, in accordance with some embodiments. For the sake of simplicity, FIG. 3B only shows one of the chip package structures 1000.

After the removal of the tray 600b, the conductive shielding material layer 710a remaining over the chip package structure 400 forms a conductive shielding film 710, in accordance with some embodiments. Each of the chip package structures 1000 includes the chip package structure 400 and the conductive shielding film 710, in accordance with some embodiments. The conductive shielding film 710 is in direct contact with and electrically connected to the grounding bumps 274, in accordance with some embodiments.

As shown in FIGS. 3A and 3B, during the formation of the conductive shielding material layer 710a, since the shielding of the redistribution structure 260, the conductive shielding film 710 (or the conductive shielding material layer 710a) over the grounding bumps 274 has a thickness T4 less than the thickness T2 of the conductive shielding film 710 over the sidewalls 402, in accordance with some embodiments. The thickness T2 is less than the thickness T1 of the conductive shielding film 710 over the top surface 401, in accordance with some embodiments.

FIG. 3B-1 is a bottom view of the chip package structure 1000 in FIG. 3B, in accordance with some embodiments. As shown in FIGS. 3B and 3B-1, the surface 269c has a central region CR and a peripheral region PR surrounding the central region CR, in accordance with some embodiments. The ground bumps 274 are positioned in the peripheral region PR, in accordance with some embodiments. In some embodiments, the range of the peripheral region PR depends on the distribution range of the ground bumps 274. The conductive shielding film 710 covering the surface 269c is in the peripheral region PR and continuously surrounds the entire central region CR, in accordance with some embodiments.

The conductive bumps 272 over the surface 269c are in the central region CR, in accordance with some embodiments. The ground bumps 274 surround the conductive bumps 272, in accordance with some embodiments. The conductive bumps 272 are electrically connected to the chip structures C and the chip package 300 and are electrically insulated from the conductive shielding film 710 and the ground bumps 274, in accordance with some embodiments.

The conductive shielding film 710 covers the surface 269c between the conductive bumps 272 and the ground bumps 274, in accordance with some embodiments. The conductive shielding film 710 covers and is electrically connected to all of the ground bumps 274, in accordance with some embodiments.

Since the conductive shielding film 710 covers the ground bumps 274 to be electrically connected to the ground bumps 274, there is no need to form conductive paths (e.g. the seal ring structure ST) in the redistribution structure 260 to electrically connect the conductive shielding film 710 to the ground bumps 274, in accordance with some embodiments. Therefore, the size of the redistribution structure 260 (or the chip package structure 1000) is reduced, in accordance with some embodiments.

In accordance with some embodiments, chip package structures and methods for forming the same are provided. The methods (for forming the chip package structure) form ground bumps projectively overlapping with (or right below) a seal ring structure to reduce a size of a chip package structure with the ground bumps and the seal ring structure. The methods form a conductive shielding film, which covers a chip structure and ground bumps of a chip package structure to be electrically connected to the ground bumps and be grounded.

In accordance with some embodiments, a chip package structure is provided. The chip package structure includes a redistribution structure including a dielectric structure, a redistribution line, and a seal ring structure. The redistribution line and the seal ring structure are in the dielectric structure, the seal ring structure continuously surrounds the redistribution line, the seal ring structure includes a first seal ring and a second seal ring over and electrically connected to the first seal ring, and the redistribution structure has a first sidewall, a first surface, and a second surface opposite to the first surface. The chip package structure includes a chip structure over the first surface. The chip package structure includes a ground bump over the second surface. The first seal ring is between the ground bump and the second seal ring. The chip package structure includes a conductive shielding film covering the chip structure and the first sidewall of the redistribution structure. The conductive shielding film, the seal ring structure, and the ground bump are electrically connected to each other.

In accordance with some embodiments, a chip package structure is provided. The chip package structure includes a redistribution structure including a dielectric structure, a redistribution line, and a seal ring structure. The redistribution line and the seal ring structure are in the dielectric structure, the seal ring structure continuously surrounds the redistribution line, and the redistribution structure has a first top surface and a first bottom surface. The chip package structure includes a chip structure over the first top surface. The chip package structure includes a ground bump over the first bottom surface. The ground bump is under the seal ring structure. The chip package structure includes a conductive shielding film covering the chip structure, the first top surface of the redistribution structure, and a second top surface, a first sidewall, and a second bottom surface of the seal ring structure.

In accordance with some embodiments, a chip package structure is provided. The chip package structure includes a redistribution structure including a dielectric structure, a redistribution line, and a seal ring structure. The redistribution line and the seal ring structure are in the dielectric structure, the seal ring structure continuously surrounds the redistribution line, and the redistribution structure has a first top surface, a sidewall, and a first bottom surface. The chip package structure includes a chip structure over the first top surface. The chip package structure includes a ground bump over the first bottom surface. The ground bump is under the seal ring structure. The chip package structure includes a conductive shielding film covering the chip structure, the first top surface, the sidewall, and the first bottom surface of the redistribution structure. The ground bump is between a portion of the conductive shielding film and the seal ring structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
a redistribution structure comprising a dielectric structure, a redistribution line, and a seal ring structure, wherein the redistribution line and the seal ring structure are in the dielectric structure, the seal ring structure continuously surrounds the redistribution line, the seal ring structure comprises a first seal ring and a second seal ring over and electrically connected to the first seal ring, and the redistribution structure has a first sidewall, a first surface, and a second surface opposite to the first surface;
a chip structure over the first surface;
a ground bump over the second surface, wherein the first seal ring is between the ground bump and the second seal ring; and
a conductive shielding film covering the chip structure and the first sidewall of the redistribution structure, wherein the conductive shielding film, the seal ring structure, and the ground bump are electrically connected to each other.

2. The chip package structure as claimed in claim 1, wherein the seal ring structure further comprises a conductive via structure in the dielectric structure and electrically connecting the first seal ring to the second seal ring, and the ground bump is under the conductive via structure.

3. The chip package structure as claimed in claim 1, wherein the conductive shielding film, the seal ring structure, and the ground bump are electrically insulated from the redistribution line and the chip structure.

4. The chip package structure as claimed in claim 1, wherein the conductive shielding film covering the first sidewall is thinner than the conductive shielding film covering the chip structure.

5. The chip package structure as claimed in claim 1, wherein the conductive shielding film further covers a portion of the second surface.

6. The chip package structure as claimed in claim 5, wherein the conductive shielding film further covers the ground bump.

7. The chip package structure as claimed in claim 6, wherein the conductive shielding film conformally covers the ground bump.

8. The chip package structure as claimed in claim 6, wherein the conductive shielding film covers the entire ground bump.

9. The chip package structure as claimed in claim 1, wherein the first seal ring has a second sidewall, the second seal ring has a third sidewall, and the conductive shielding film is in direct contact with the second sidewall and the third sidewall.

10. The chip package structure as claimed in claim 9, wherein the conductive shielding film is further in direct contact with the ground bump.

11. A chip package structure, comprising:
a redistribution structure comprising a dielectric structure, a redistribution line, and a seal ring structure, wherein the redistribution line and the seal ring structure are in the dielectric structure, the seal ring structure continuously surrounds the redistribution line, and the redistribution structure has a first top surface and a first bottom surface;
a chip structure over the first top surface;
a ground bump over the first bottom surface, wherein the ground bump is under the seal ring structure; and
a conductive shielding film covering the chip structure, the first top surface of the redistribution structure, and a second top surface, a first sidewall, and a second bottom surface of the seal ring structure.

12. The chip package structure as claimed in claim 11, wherein the conductive shielding film, the seal ring structure, and the ground bump are electrically connected to each other and are electrically insulated from the redistribution line and the chip structure.

13. The chip package structure as claimed in claim 11, wherein the conductive shielding film further covers the ground bump.

14. The chip package structure as claimed in claim 11, wherein the conductive shielding film further covers the first bottom surface between the redistribution line and the seal ring structure.

15. The chip package structure as claimed in claim 11, wherein the seal ring structure comprises a first seal ring and a second seal ring over and electrically connected to the first seal ring, the first seal ring has a second sidewall, the second seal ring has a third sidewall, the dielectric structure has a fourth sidewall, the second sidewall, the third sidewall, and the fourth sidewall are substantially coplanar, and the conductive shielding film is in direct contact with the second sidewall, the third sidewall, and the fourth sidewall.

16. A chip package structure, comprising:
a redistribution structure comprising a dielectric structure, a redistribution line, and a seal ring structure, wherein the redistribution line and the seal ring structure are in the dielectric structure, the seal ring structure continuously surrounds the redistribution line, and the redistribution structure has a first top surface, a sidewall, and a first bottom surface;
a chip structure over the first top surface;
a ground bump over the first bottom surface, wherein the ground bump is under the seal ring structure; and
a conductive shielding film covering the chip structure, the first top surface, the sidewall, and the first bottom surface of the redistribution structure, wherein the ground bump is between a portion of the conductive shielding film and the seal ring structure.

17. The chip package structure as claimed in claim 16, wherein the portion of the conductive shielding film is in direct contact with the ground bump.

18. The chip package structure as claimed in claim 16, wherein the portion of the conductive shielding film is thinner than the conductive shielding film covering the sidewall of the redistribution structure.

19. The chip package structure as claimed in claim 16, wherein a second top surface of the dielectric structure and a third top surface of the seal ring structure are substantially coplanar.

20. The chip package structure as claimed in claim 16, wherein the portion of the conductive shielding film conformally covers the ground bump.

* * * * *